United States Patent
Han

(10) Patent No.: US 10,095,825 B2
(45) Date of Patent: Oct. 9, 2018

(54) COMPUTER BASED SYSTEM FOR VERIFYING LAYOUT OF SEMICONDUCTOR DEVICE AND LAYOUT VERIFY METHOD THEREOF

(71) Applicant: Samsung Electronics Co., Ltd., Suwon-si, Gyeonggi-do (KR)

(72) Inventor: Changho Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 242 days.

(21) Appl. No.: 14/843,491

(22) Filed: Sep. 2, 2015

(65) Prior Publication Data

US 2016/0085903 A1 Mar. 24, 2016

Related U.S. Application Data

(60) Provisional application No. 62/052,076, filed on Sep. 18, 2014.

(30) Foreign Application Priority Data

Jan. 26, 2015 (KR) .................. 10-2015-0012154

(51) Int. Cl.
*G06F 17/50* (2006.01)
(52) U.S. Cl.
CPC ........ *G06F 17/5081* (2013.01); *G06F 17/505* (2013.01)
(58) Field of Classification Search
CPC .................................. G06F 17/5081
USPC .......................................... 716/103
See application file for complete search history.

(56) References Cited

U.S. PATENT DOCUMENTS

| 5,661,419 A | 8/1997 | Bhagwan |
| 6,423,558 B1 | 7/2002 | Maeda et al. |
| 6,469,493 B1 | 10/2002 | Muething, Jr. et al. |
| 6,532,579 B2 | 3/2003 | Sato et al. |
| 6,662,350 B2 | 12/2003 | Fried et al. |
| 7,102,413 B2 | 9/2006 | Kuroda |
| 7,547,597 B2 | 6/2009 | Kau et al. |

(Continued)

FOREIGN PATENT DOCUMENTS

| JP | 11211793 | 8/1999 |
| JP | 3233347 B2 | 11/2001 |

(Continued)

OTHER PUBLICATIONS

U.S. Notice of Allowance dated Feb. 16, 2017 issued in co-pending U.S. Appl. No. 14/848,758.

(Continued)

*Primary Examiner* — Suresh Memula
(74) *Attorney, Agent, or Firm* — Harness, Dickey & Pierce, P.L.C.

(57) ABSTRACT

There is provided a method of verifying a Fin-based integrated circuit layout in a layout verifying system. The method includes receiving a layout corresponding to a specific integrated circuit unit, extracting one or more device codes from the layout, and synthesizing a code stream using the one or more extracted device codes according to a gate line sequence. Each device code is based on a corresponding gate line unit in the layout that includes an active region, gate lines, and a number of intersecting points with silicon fins of the layout.

20 Claims, 19 Drawing Sheets

(56) References Cited

U.S. PATENT DOCUMENTS

| | | | |
|---|---|---|---|
| 7,685,540 B1 | 3/2010 | Madden et al. | |
| 7,917,872 B2 | 3/2011 | Tanefusa et al. | |
| 7,956,421 B2 | 6/2011 | Becker | |
| 7,960,759 B2 | 6/2011 | Frederick et al. | |
| 8,102,018 B2 | 1/2012 | Bertin et al. | |
| 8,138,783 B2 | 3/2012 | Rius Vazquez et al. | |
| 8,183,114 B2 | 5/2012 | Tsuboi et al. | |
| 8,224,604 B1 | 7/2012 | Amrutur et al. | |
| 8,239,803 B2 | 8/2012 | Kobayashi | |
| 8,258,578 B2 | 9/2012 | Carlson | |
| 8,264,044 B2 | 9/2012 | Becker | |
| 8,281,272 B1 * | 10/2012 | Ginetti | G06F 17/5068 716/119 |
| 8,312,394 B2 | 11/2012 | Ban et al. | |
| 8,352,899 B1 | 1/2013 | Yap et al. | |
| 8,362,480 B1 | 1/2013 | Hess et al. | |
| 8,365,108 B2 | 1/2013 | Baum et al. | |
| 8,397,193 B2 | 3/2013 | Ting et al. | |
| 8,453,089 B2 | 5/2013 | Teoh et al. | |
| 8,490,244 B1 * | 7/2013 | Joshi | G06F 17/5068 716/110 |
| 8,569,841 B2 | 10/2013 | Becker et al. | |
| 8,581,348 B2 | 11/2013 | Rashed et al. | |
| 8,631,382 B2 | 1/2014 | Wang et al. | |
| 8,653,630 B2 | 2/2014 | Liaw et al. | |
| 8,689,157 B1 * | 4/2014 | Lo | G06F 17/5081 700/110 |
| 8,726,215 B2 | 5/2014 | Lee et al. | |
| 8,726,217 B2 | 5/2014 | Gullette | |
| 8,726,220 B2 | 5/2014 | Lin et al. | |
| 8,732,641 B1 | 5/2014 | Yuh et al. | |
| 8,741,763 B2 | 6/2014 | Ma et al. | |
| 8,775,977 B2 | 7/2014 | Hsu et al. | |
| 8,775,999 B2 | 7/2014 | Chueh et al. | |
| 8,782,575 B1 | 7/2014 | Hsu et al. | |
| 8,782,586 B2 | 7/2014 | Sezginer et al. | |
| 8,799,834 B1 | 8/2014 | Chen et al. | |
| 8,802,574 B2 | 8/2014 | Yuan et al. | |
| 8,826,213 B1 * | 9/2014 | Ho | G06F 17/5036 716/110 |
| 8,853,794 B2 | 10/2014 | Becker et al. | |
| 8,878,303 B2 | 11/2014 | Hatamian et al. | |
| 8,902,094 B1 | 12/2014 | Zhang et al. | |
| 8,904,337 B2 | 12/2014 | Yang et al. | |
| 8,924,908 B2 | 12/2014 | Kawa et al. | |
| 8,946,824 B2 | 2/2015 | Ikegami et al. | |
| 8,947,912 B2 | 2/2015 | Calhoun et al. | |
| 8,969,199 B1 | 3/2015 | Yuan et al. | |
| 8,987,128 B2 | 3/2015 | Rashed et al. | |
| 8,997,026 B1 | 3/2015 | Sweis | |
| 9,009,641 B2 | 4/2015 | Becker et al. | |
| 9,021,405 B2 | 4/2015 | Hiramoto et al. | |
| 9,035,393 B2 | 5/2015 | Ma et al. | |
| 9,355,910 B2 | 5/2016 | Rashed et al. | |
| 9,740,811 B2 * | 8/2017 | Chen | G06F 17/5072 |
| 2001/0044918 A1 | 11/2001 | Sato et al. | |
| 2003/0016551 A1 | 1/2003 | Takemura et al. | |
| 2003/0145299 A1 | 7/2003 | Fried et al. | |
| 2003/0200493 A1 | 10/2003 | Campbell | |
| 2003/0200512 A1 * | 10/2003 | Lam | G06F 17/50 716/55 |
| 2004/0012429 A1 | 1/2004 | Lindberg et al. | |
| 2004/0109368 A1 | 6/2004 | Kuroda | |
| 2004/0133868 A1 | 7/2004 | Ichimiya | |
| 2005/0044522 A1 | 2/2005 | Maeda | |
| 2005/0155001 A1 | 7/2005 | Kinoshita et al. | |
| 2006/0136848 A1 | 6/2006 | Ichiryu et al. | |
| 2006/0225016 A1 | 10/2006 | Fukasawa | |
| 2006/0267224 A1 | 11/2006 | Kau et al. | |
| 2006/0288315 A1 * | 12/2006 | Perez | G06F 17/5068 716/103 |
| 2007/0075718 A1 | 4/2007 | Hess et al. | |
| 2008/0046849 A1 * | 2/2008 | Choi | G06F 17/5068 716/53 |
| 2008/0109778 A1 * | 5/2008 | Hsieh | G06F 17/5068 716/122 |
| 2008/0216041 A1 | 9/2008 | Wangxiao et al. | |
| 2008/0270064 A1 | 10/2008 | Bhushan et al. | |
| 2009/0037855 A1 | 2/2009 | Tanefusa et al. | |
| 2009/0091346 A1 | 4/2009 | Chuang et al. | |
| 2009/0144677 A1 | 6/2009 | Gonzalez et al. | |
| 2009/0224317 A1 | 9/2009 | Becker | |
| 2009/0315583 A1 | 12/2009 | Rius Vazquez et al. | |
| 2010/0090260 A1 | 4/2010 | Frederick et al. | |
| 2010/0093145 A1 | 4/2010 | Tsuboi et al. | |
| 2010/0187615 A1 | 7/2010 | Becker | |
| 2010/0201376 A1 | 8/2010 | Ouyang et al. | |
| 2010/0252892 A1 | 10/2010 | Becker | |
| 2010/0269073 A1 | 10/2010 | Ting et al. | |
| 2011/0014786 A1 | 1/2011 | Sezginer et al. | |
| 2011/0049635 A1 | 3/2011 | Carlson | |
| 2011/0131440 A1 | 6/2011 | Noda | |
| 2011/0289467 A1 | 11/2011 | Kobayashi | |
| 2012/0137261 A1 | 5/2012 | Ban et al. | |
| 2012/0180006 A1 | 7/2012 | Baum et al. | |
| 2012/0192135 A1 | 7/2012 | Gullette | |
| 2012/0210279 A1 | 8/2012 | Hsu et al. | |
| 2012/0254817 A1 | 10/2012 | Sherlekar | |
| 2012/0278777 A1 | 11/2012 | Lin et al. | |
| 2012/0299065 A1 | 11/2012 | Shimizu | |
| 2012/0329266 A1 | 12/2012 | Hiramoto et al. | |
| 2013/0016982 A1 | 1/2013 | Henzler | |
| 2013/0021075 A1 | 1/2013 | Felix | |
| 2013/0026572 A1 | 1/2013 | Kawa et al. | |
| 2013/0036397 A1 | 2/2013 | Lee et al. | |
| 2013/0042216 A1 | 2/2013 | Loh et al. | |
| 2013/0086542 A1 | 4/2013 | Teoh et al. | |
| 2013/0126978 A1 * | 5/2013 | Becker | H01L 27/092 257/369 |
| 2013/0146982 A1 | 6/2013 | Rashed et al. | |
| 2013/0200395 A1 | 8/2013 | Liaw et al. | |
| 2013/0239077 A1 | 9/2013 | Wang et al. | |
| 2013/0242645 A1 | 9/2013 | Calhoun et al. | |
| 2013/0244427 A1 | 9/2013 | Yuan et al. | |
| 2013/0292772 A1 | 11/2013 | Ma et al. | |
| 2013/0298092 A1 * | 11/2013 | Ting | G06F 19/00 716/102 |
| 2013/0320451 A1 | 12/2013 | Liu et al. | |
| 2014/0027918 A1 | 1/2014 | Rashed et al. | |
| 2014/0054722 A1 | 2/2014 | Kawa et al. | |
| 2014/0119099 A1 | 5/2014 | Clark et al. | |
| 2014/0130003 A1 | 5/2014 | Cheuh et al. | |
| 2014/0131816 A1 | 5/2014 | Wang et al. | |
| 2014/0137062 A1 | 5/2014 | Yuh et al. | |
| 2014/0183646 A1 | 7/2014 | Hatamian et al. | |
| 2014/0185365 A1 | 7/2014 | Liaw | |
| 2014/0189635 A1 | 7/2014 | Yang et al. | |
| 2014/0203378 A1 | 7/2014 | Ou et al. | |
| 2014/0208282 A1 | 7/2014 | Hsu et al. | |
| 2014/0210014 A1 | 7/2014 | Ma et al. | |
| 2014/0210015 A1 | 7/2014 | Becker et al. | |
| 2014/0255164 A1 | 9/2014 | Hayes-Pankhurst et al. | |
| 2014/0264894 A1 | 9/2014 | Tien et al. | |
| 2014/0282325 A1 * | 9/2014 | Chen | G06F 17/5081 716/111 |
| 2014/0344770 A1 * | 11/2014 | Chiang | G06F 17/5072 716/119 |
| 2015/0093910 A1 * | 4/2015 | Tan | G06F 17/5072 438/761 |
| 2015/0143309 A1 | 5/2015 | De Dood et al. | |
| 2015/0213184 A1 | 7/2015 | Yuan et al. | |
| 2015/0234977 A1 * | 8/2015 | Lee | G06F 17/5081 716/52 |
| 2015/0287604 A1 | 10/2015 | Stephens et al. | |
| 2015/0370949 A1 | 12/2015 | Moroz et al. | |
| 2015/0370950 A1 | 12/2015 | Kawa et al. | |
| 2016/0025805 A1 | 1/2016 | Uppal et al. | |

(56) References Cited

U.S. PATENT DOCUMENTS

2016/0055290 A1* 2/2016 Weng .................. H01L 27/0207
257/401

FOREIGN PATENT DOCUMENTS

| JP | 200350266 | A | 2/2003 |
|---|---|---|---|
| JP | 2003149983 | A | 5/2003 |
| JP | 2005149313 | A | 6/2005 |
| JP | 2005252143 | A | 9/2005 |
| JP | 2007264993 | A | 10/2007 |
| JP | 2010266254 | A | 11/2010 |
| JP | 2011233869 | A | 11/2011 |
| JP | 5153089 | B2 | 2/2013 |
| JP | 2013120852 | A | 6/2013 |
| JP | 2014131063 | A | 7/2014 |
| KR | 100480585 | B1 | 6/2005 |
| KR | 2007109434 | A | 11/2007 |
| KR | 20080045517 | A | 5/2008 |
| KR | 20120125275 | A | 11/2012 |
| KR | 20130067213 | A | 6/2013 |
| KR | 20140012012 | A | 1/2014 |
| KR | 20140043399 | A | 4/2014 |

OTHER PUBLICATIONS

U.S. Notice of Allowance dated Mar. 2, 2017 issued in co-pending U.S. Appl. No. 14/854,358.
Notice of Allowance dated May 15, 2017 issued in co-pending U.S. Appl. No. 14/844,420.
U.S. Appl. No. 14/844,420, filed Sep. 3, 2015.
U.S. Appl. No. 14/848,758, filed Sep. 9, 2015.
U.S. Office Action dated Jul. 11, 2017 issued in co-pending U.S. Appl. No. 14/844,398.
U.S. Office Action dated Oct. 21, 2016 issued in co-pending U.S. Appl. No. 14/854,358.
U.S. Appl. No. 14/854,358, filed Sep. 15, 2015.
U.S. Office Action dated Jan. 26, 2017 issued in co-pending U.S. Appl. No. 14/844,420.
U.S. Office Action dated Feb. 2, 2017 issued in co-pending U.S. Appl. No. 14/844,398.
"Binary Decoder", Electronics Tutorials, pp. 1-5 (2014).
"Standard cell", Wikipedia, the Free Encyclopedia, pp. 1-5 (2013).
U.S. Office Action dated Oct. 19, 2017 issued in co-pending U.S. Appl. No. 15/711,390.
U.S. Appl. No. 14/844,398, filed Sep. 3, 2015.
U.S. Appl. No. 15/614,911, filed Jun. 6, 2017.
U.S. Appl. No. 15/711,390, filed Sep. 21, 2017.
Office Action for corresponding U.S. Appl. No. 14/844,398 dated Oct. 30, 2017.
U.S. Office Action dated Sep. 12, 2016 issued in co-pending U.S. Appl. No. 14/848,758.
Hess, et al. "Direct Probing Characterization Vehicle Test Chip for Wafer Level Exploration of Transistor Pattern on Product Chips," IEEE Confrence on Microelectronic Test Structures, pp. 219-223 (2014).
U.S. Office Action dated Apr. 20, 2018 issued in co-pending U.S. Appl. No. 15/614,911.
U.S. Notice of Allowance dated Mar. 7, 2018 issued in co-pending U.S. Appl. No. 14/844,398.

* cited by examiner

COMPUTER BASED SYSTEM FOR VERIFYING LAYOUT OF SEMICONDUCTOR DEVICE AND LAYOUT VERIFY METHOD THEREOF

CROSS-REFERENCE TO RELATED APPLICATIONS

A claim for priority under 35 U.S.C. § 119 is made to U.S. Provisional Application No. 62/052,076 filed Sep. 18, 2014, in the U.S. Patent Trademark Office, and Korean Patent Application No. 10-2015-0012154 filed Jan. 26, 2015, in the Korean Intellectual Property Office, the entire contents of which are hereby incorporated by reference.

BACKGROUND

The present disclosure relates to a semiconductor device, and more particularly, relate to a computer-based system capable of verifying a layout of a semiconductor device and a layout verifying method of the computer-based system.

In recent years, the use of mobile devices, such as a smart phone, a tablet PC, a digital camera, an MP3 player, and a PDA has been explosively increased. In such mobile devices, as driving of multimedia and throughput of various data are increased, a high-speed processor is being used. A variety of application programs are driven on the mobile device. The mobile device may use semiconductor IC devices, such as a working memory (e.g., DRAM), a non-volatile memory, and an application processor (hereinafter referred to as "AP"), to drive various application programs.

Layout design and verification for implementing a schematic circuit on a silicon wafer may be used to manufacture the above-described semiconductor device. A layout engineer extracts a layout of the schematic circuit using an automatized layout design system for driving a variety of software tools. Schematic expression about the layout may be required to verify the layout. For example, a LVS (Layout Versus Schematic) verification tool may use such a method. A variety of parameters may be used to express a layout corresponding to one device. However, an excessive amount of information may be used to express a device using such parameters. Accordingly, there may be required a parameter extracting method for simply expressing a layout by the device, cell or block for efficient layout design, analysis, and verification.

SUMMARY

Example embodiments of inventive concepts provide a layout verifying method capable of simplifying layout parameters for expressing a device and a layout verifying system using the layout verifying method.

According to example embodiments of inventive concepts, a method of verifying a Fin-based integrated circuit layout using a layout verifying system is provided. The method includes receiving a layout corresponding to a specific integrated circuit unit; extracting one or more device codes from the layout, each device code being based on a corresponding gate line unit in the layout that includes an active region, gate lines, and a number of intersecting points with silicon fins; and synthesizing a code stream using the one or more extracted device codes according to a gate line sequence.

In example embodiments, the extracting one or more device codes may include assigning a code of "0" to one gate line that does not overlap with the active region from among the gate lines.

In example embodiments, the extracting one or more device codes may include dividing the code of "0" corresponding to the one gate line into sub-codes according to a distance between the one gate line and an active region adjacent to the one gate line.

In example embodiments, the extracting one or more device codes may include assigning a code to one gate line among the gate lines based on the corresponding number of silicon fins that are intersected by the one gate line.

In example embodiments, the specific integrated circuit may correspond to at least one of a transistor device, a cell, a block, and a chip.

In example embodiments, the method may further include classifying the synthesized one or more device codes according to a pattern unit have a same code stream.

In example embodiments, the specific integrated circuit unit may correspond to one device. The method may further include extracting the one or more device codes about various layout shapes for the device.

In example embodiments, the method may further include forming a test pattern by randomly connecting and synthesizing device codes corresponding to the various layout shapes.

In example embodiments, the method may further include converting the device codes into a schematic parameter for expressing a schematic circuit.

In example embodiments, the method may further include forming a netlist using the schematic parameter, and perming schematic simulation using the netlist.

According to example embodiments of inventive concepts, a method for detecting the same pattern as a target pattern in a specific integrated circuit unit in a layout design and verifying system is provided. The method includes receiving a layout of the target pattern; extracting a target device code from the layout of the target pattern, the target device code being based on an active region, gate lines, and a number of intersecting points with silicon fins of the layout of the target pattern; determining whether a test code includes a same portion as the target device code by sequentially scanning the test code, the test code corresponding to the specific integrated circuit; and storing information about a location where the test code includes the same portion as the target device code if the same portion as the target device code is detected in the test code.

In example embodiments, the target device code may be extracted as a value corresponding to the number of events that gate lines overlapped with the active region are intersected with the silicon fins.

In example embodiments, the method may include converting a layout corresponding the specific integrated circuit into the test code.

In example embodiments, the specific integrated circuit may correspond to at least one of a chip, a block, or cells.

According to example embodiments of inventive concepts, a computer-based system which designs and verifies a semiconductor integrated circuit is provided. The computer-based system includes an input/output device, a working memory, and a working memory. The input/output device may input and output a layout of the semiconductor input/output. The working memory may load a layout-code conversion algorithm for generating a device code by a gate line unit based on an active region, gate lines, and the number of intersecting points with silicon fins of the layout or for converting the device code into the layout. The central processing unit may execute the layout-code conversion algorithm to process a layout or a device code provided from the input/output device.

According to example embodiments of inventive concepts, it is possible to express a complicated layout in the form of simple code. In addition, conversion between a parameter and a layout is free regardless of any layout shape. Accordingly, it is possible to design, analyze and verify a device, a cell, a block, or a chip efficiently using a code generated according to a layout design method according to example embodiments of inventive concepts.

According to example embodiments of inventive concepts, a method of operating a layout verifying system including a process is provided. The method includes receiving a circuit layout that corresponds to a circuit, extracting device codes from the circuit layout using the processor, and one of (i) synthesizing a code stream from the device codes, and (ii) determining whether a target device code that corresponds to a target pattern, is the same as one of the device codes by sequentially scanning the device codes for a match. The device codes are each an expression of gate line units in the layout. The extracting the device code from the circuit layout includes assigning different values to the gate lines based on corresponding structures in the circuit layout that intersect the gate lines.

In example embodiments, the circuit may be a Fin-based integrated circuit. The gate lines in the circuit layout may include first gate lines and second gate lines. The first gate lines may cross a non-active region. The second gate lines may cross an active region. The extracting the device code from the circuit layout may include assigning a "0" to the first gate lines, and assigning values to the second gate lines respectively based on a number of fins that intersect each respective one of the second gate lines.

In example embodiments, the method may include the determining whether the target device code that corresponds to the target pattern is the same as one of the device codes by sequentially scanning the device codes for the match, and the method may further include storing information about locations of the matching codes in a memory of the layout verifying system.

In example embodiments, the method may further include converting the device codes into a schematic parameter for expressing a schematic circuit.

In example embodiments, the method may further include forming a netlist using the schematic parameter, and perming schematic simulation using the netlist.

BRIEF DESCRIPTION OF THE FIGURES

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
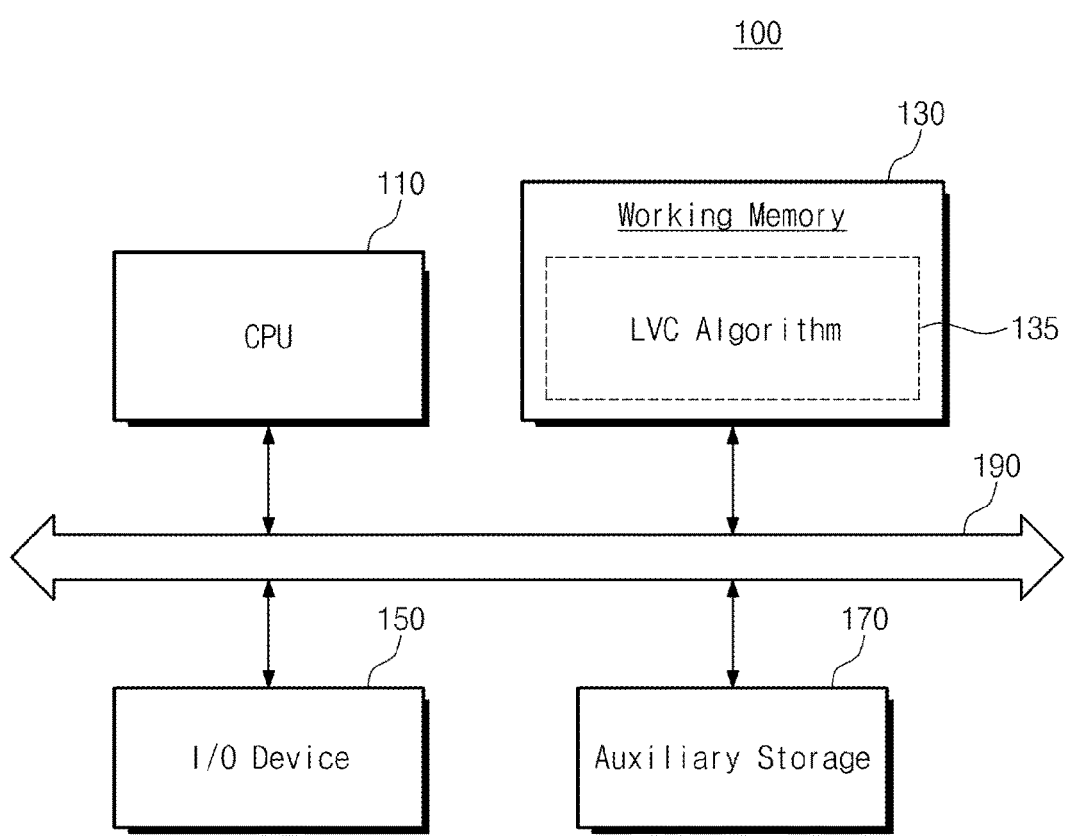
FIG. 1 is a block diagram schematically illustrating a layout verifying system according to example embodiments of inventive concepts.

Example embodiments of inventive concepts will be described in detail with reference to the accompanying drawings. Example embodiments of inventive concepts, however, may be embodied in various different forms, and should not be construed as being limited only to the illustrated embodiments. Rather, these example embodiments are provided as examples so that this disclosure will be thorough and complete, and will fully convey the scope of inventive concepts to those skilled in the art. Accordingly, known processes, elements, and techniques may not be described with respect to some example embodiments of inventive concept. Unless otherwise noted, like reference numerals denote like elements throughout the attached drawings and written description, and thus descriptions may not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments of inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" can encompass both an orientation of above and below. The device may be otherwise oriented (rotated 90 degrees or at other orientations) and the spatially relative descriptors used herein interpreted accordingly.

In addition, it will also be understood that when a layer is referred to as being "between" two layers, it can be the only layer between the two layers, or one or more intervening layers may also be present. As used herein the term "and/or" includes any and all combinations of one or more of the associated listed items.

The terminology used herein is for the purpose of describing particular embodiments only and is not intended to be limiting of example embodiments of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which example embodiments of inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a layout verifying system 100 according to example embodiments of inventive concepts. Referring to FIG. 1, a layout verifying system 100 contains a Central Processing Unit (CPU) 110, a working memory 130, an input/output device 150, a storage device 170, and a bus 190. Here, the layout verifying system 100 may be used as a dedicated device for transforming between a layout and a code parameter, analysis, verification, and pattern matching analysis. However, the layout verifying system 100 may be a computer for driving a variety of simulation tools or design tools.

The CPU 110 executes pieces of software (e.g., an application program, an operating system, device drivers, etc.) to be executed on the layout verifying system 100. The CPU 110 may execute an operating system (not shown) loaded on the working memory 130. The CPU 110 may execute application programs, which will be driven based on the operating system, or design and verification tools. For example, the CPU 110 may execute an LVC (Layout-to-Code) algorithm 135 loaded on the working memory 130. In example embodiments of inventive concepts, the CPU 110 converts a layout structure of a device or cell into a device code by driving the LVC algorithm 135.

The working memory 130 may be used to load the operating system or application programs. In booting the layout verifying system 100, an OS image (not shown) stored at the storage device 170 is loaded on the working memory 130 according to a booting sequence. Overall input/output operations of the layout verifying system 100 may be supported by the operating system. Likewise, application programs selected by a user or provided for a basic service may be loaded on the working memory 130. In particular, in example embodiments of inventive concepts, the LVC algorithm 135 may be loaded on the working memory 130 from the storage device 170. Although not shown, the working memory 130 may be used to further load a tool for designing and verifying a schematic circuit or layout design tools for automatically generated a layout corresponding to the schematic circuit.

The working memory 130 may be a volatile memory such as an SRAM or a DRAM or a nonvolatile memory such as a PRAM, a MRAM, a ReRAM, a FRAM, or a NOR flash memory.

In example embodiments, the LVC algorithm 135 converts a layout, which is generated after verifying the schematic circuit, into a device code. The LVC algorithm 135 converts the device code into a layout. The LVC algorithm 135 may perform layout analyzing, verifying, and testing based on the device code. For example, the LVC algorithm 135 converts a parameter corresponding to a transistor using only some bits. That is, the LVC algorithm 135 may convert a parameter into a code of several bits only using an active shape of a device and the number of fins. Unlike parameters (e.g., a gate width, a gate position, active width and position, width, etc.) for expressing a conventional device, the LVC algorithm 135 according to example embodiments of inventive concepts may express all devices using a device code of several bits.

In addition, in example embodiments of inventive concepts, the LVC algorithm 135 may easily convert a device code into a layout. The LVC algorithm 135 may express all layouts about a device and a cell, a block, and a chip formed of devices using device codes. A detailed function of the LVC algorithm 135 will be more fully described with reference to accompanying drawings.

The input/output device 150 controls user input and output via user interface devices. For example, the input/output device 150 may include input devices such as a keyboard, a mouse, and a touch pad and output devices such as a monitor, etc. and may receive a layout of which the schematic verification is completed. Alternatively, a device code may be received via the input/output device 150 and may be then converted into a layout. The input/output device 150 may display transform between a layout and a device code, analysis about a device or cell, or a processed result of the layout verifying system 100.

The storage device 170 may be provided as a storage medium of the layout verifying system 100. The storage device 170 may store application programs, an operating system image, and various types of data. The storage device 170 may be implemented with a memory card (MMC, eMMC, SD, MicroSD, etc.) or a hard disk drive. The storage device 170 may include a NAND type flash memory having a mass storage capacity. Alternatively, the storage device 170 may include next-generation nonvolatile memories such as a PRAM, a MRAM, a ReRAM, a FRAM, etc. or a NOR flash memory.

The system bus 190 may be provided as an interconnector for providing a network in the layout verifying system 100. The CPU 110, the working memory 130, the input/output device 150, and the storage device 170 are electrically connected via the system bus 190 and exchange data via the system bus 190. However, example embodiments are not limited thereto. For example, the system bus 190 may further include an arbitration means for efficient management.

In example embodiments of inventive concepts, the layout verifying system 100 may convert an input layout into a simplified device code. The layout converted into the device code may be used as a source for analyzing an integrated circuit or as a source for pattern matching. The device code expresses a device using a code having the relatively less number of bits, thereby improving a speed in analyzing or verifying a layout markedly. In other words, the CPU 110 may be configured as a special purpose processor by executing the LVC algorithm 135 loaded on the working memory 130. In example embodiments, the functionality of the layout verifying system 100 may be improved by the CPU executing the LVC algorithm 135 because the layout verification or pattern matching may be more efficient when the layout is converted into the device code at least because fewer bits are used to express the layout in the device code.

Figure 2:
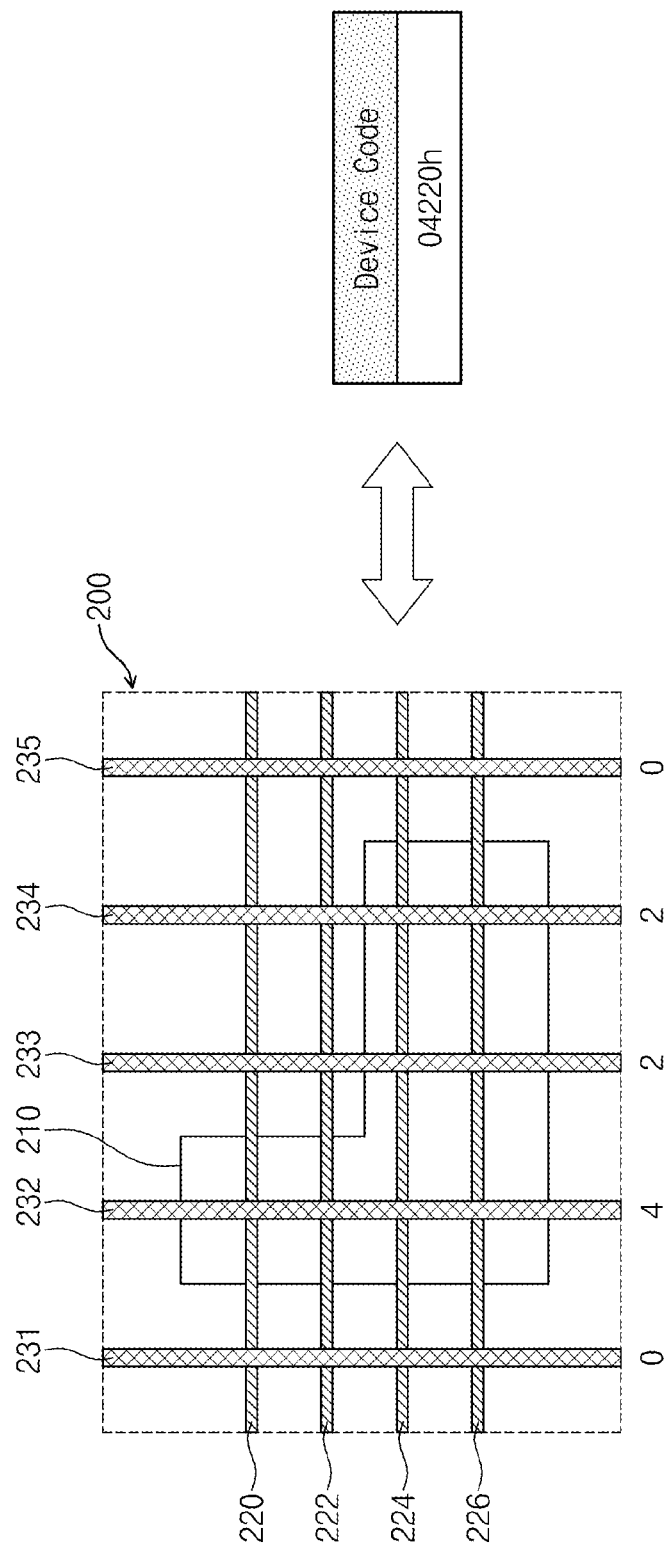
FIG. 2 is a diagram schematically illustrating conversion between a layout and a device code, according to example embodiments of inventive concepts.

FIG. 2 is a diagram schematically illustrating conversion between a layout and a device code, according to example embodiments of inventive concepts. Referring to FIG. 2, a layout 200 and a device code may be mutually converted by an LVC algorithm 135 (refer to FIG. 1).

The layout 200 will be described using a FinFET having a Fin structure as an example. However, example embodiments are not limited thereto and structures other than FinFETs may be expressed. The layout 200 that forms at least one FinFET includes an active region 210, a plurality of silicon fins 220, 222, 224, and 226 formed thereon, and gate lines 231, 232, 233, 234, and 235. The active region 210 is formed by injecting dopants onto a substrate, and three transistors are formed at the active region 210 together with the gate lines 232, 233, and 234 made of poly silicon. That is, the gate line 232 and the four silicon fins 220, 222, 224, and 226 constitute one FinFET having a four-fin structure, and the gate lines 233 and 234 and the two silicon fins 224 and 226 constitute two FinFETs having a two-fin structure.

Geometry information including the number of fins, shape of an active region, number of gate lines, etc. may be required to extract general parameters about one FinFET having the four fin structure and two FinFET having the two fin structure. According to the LVC algorithm 135 in example embodiments of inventive concepts, however, the geometry information may be expressed using a simple device code of several bits. That is, the layout 200 where three FinFET includes information may be expressed by a device code of "04220h". Here, a code may be expressed by a hexadecimal number. However, example embodiments of inventive concepts are not limited thereto. For example, the device code may be expressed using various codes such as a binary number, an octal number, etc.

In detail, a code of "0h" may be assigned to the gate line 231 that is not intersected with the active region 210. A code of "4h" may be assigned to the gate line 232 that is intersected with the active region 210 and the four silicon fins 220, 222, 224, and 226. A code of "2h" may be assigned to the gate line 233 that is intersected with the active region 210 and the two silicon fins 224 and 226. A code of "2h" may be assigned to the gate line 234 that is intersected with the active region 210 and the two silicon fins 224 and 226. A code of "0h" may be assigned to the gate line 235 that is not intersected with the active region 210 and the two silicon fins 224 and 226.

Three transistors defined at the active region 210 may be expressed by a device code of "04220h" according to the above-described method. That is, code values between code values of "0" may be used as layout information for expressing the size or characteristic of transistors actually. In other words, the "422" part of "04220h" may correspond to the transistors including gate lines 232 to 234. If the above-described expression method is used, a layout to be expressed using dozens of parameters may be expressed only using several bits.

In addition, the device code of "04220h" may be easily converted into the layout 200. That is, the active region 210 may be formed to be intersected with four silicon fins, two silicon fins, and two silicon fins between the gate lines 231 and 235 that do not have an intersecting point. Accordingly, the layout 200 may be easily expressed only using the device code of "04220h".

Figure 3:
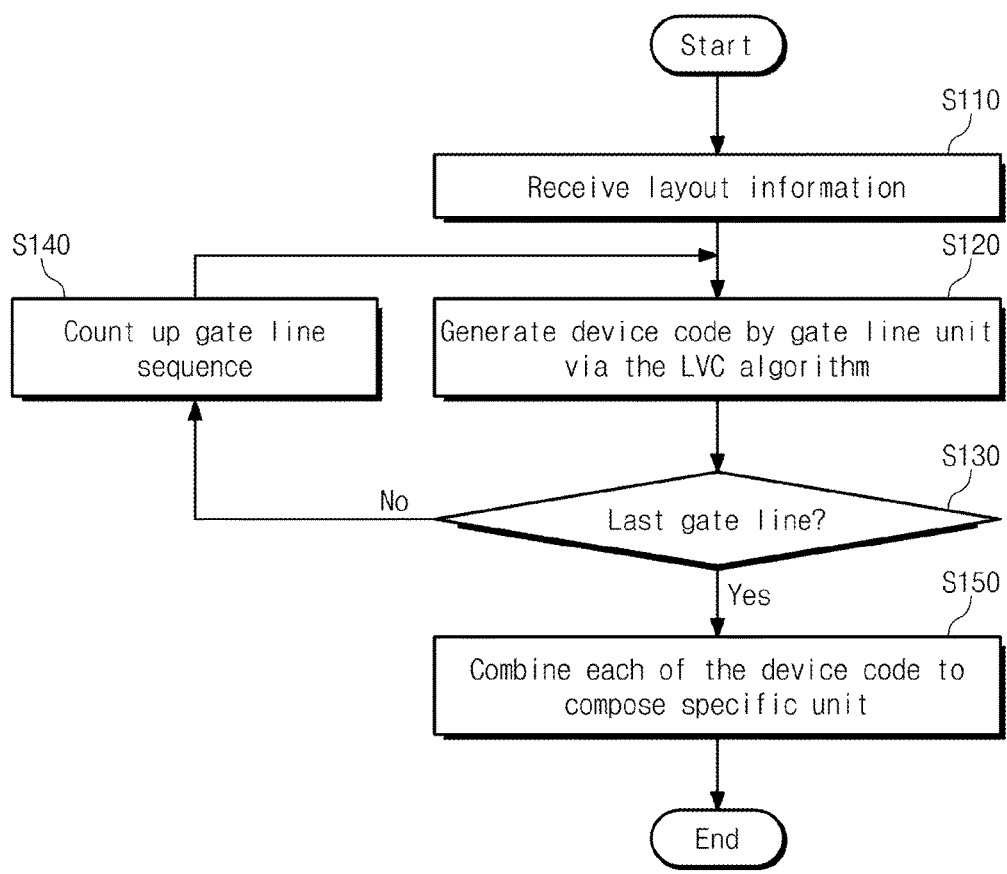
FIG. 3 is a flow chart schematically illustrating a method for converting a layout into a device code, according to example embodiments of inventive concepts.

FIG. 3 is a flow chart schematically illustrating a method for converting a layout into a device code, according to example embodiments of inventive concepts. Referring to FIG. 3, input layout information is converted into a device code by a layout verifying system 100 using an LVC algorithm 135 (refer to FIG. 1).

In operation S110, a layout verifying system 100 (refer to FIG. 1) is provided with layout information of a specific unit by a design engineer or a layout design tool. That is, the layout information is received by a device, cell, block, or chip unit. Here, the device may be a transistor to be converted into a device code. The layout information, for example, may be layout information, which a design tool automatically generates, or a two-dimensional or three-dimensional drawing.

In operation S120, the layout verifying system 100 may use the LVC algorithm 135 (e.g., the CPU 110 in FIG. 1 may use the LVC algorithm) to sequentially assign device codes from a left-to-right direction or in a right-to-left direction with respect to gate lines of the device. The LVC algorithm 135 may be used to assign a device code of "0h" to a gate line that is not intersected with an active region. In the event that a gate line is intersected with the active region, a device code is generated according to the number of events that a gate line and a silicon fin intersect. A method for generating a device code will be more fully described later.

In operation S130, the layout verifying system 100 may determine whether a gate line to which a device code may be assigned in operation S120 is the last gate line of a layout defined to assign a device code. For example, if a layout needed to generate a device code corresponds to a cell unit, gate lines to which device codes are respectively assigned may be sequentially selected. If generating of a device code about the last gate line is completed (Yes), the method proceeds to operation S140. In contrast, if a gate line to which a device code is not assigned exists (No), the method proceeds to operation S150.

In operation S140, since an input layout structure includes a gate line to which a device code is not assigned, a gate line sequence is counted up. The count-up sequence may be from left to right or from right to left. After counting up of the gate line sequence, the method proceeds to operation S120 to assign a device code to a gate line corresponding to the counted-up gate line sequence.

In operation S150, device codes about the layout may be synthesized into a code stream using the layout verifying system 100. The synthesized layout may form, for example, a code stream corresponding to a cell unit, a block unit, or a chip unit.

As an example, an operation of the LVC algorithm 135 for converting one layout unit into a device code. The LVC algorithm 135 may easily convert a layout, corresponding to a device unit, a cell unit, a block unit, or a chip unit, into a device code.

Figure 4A:
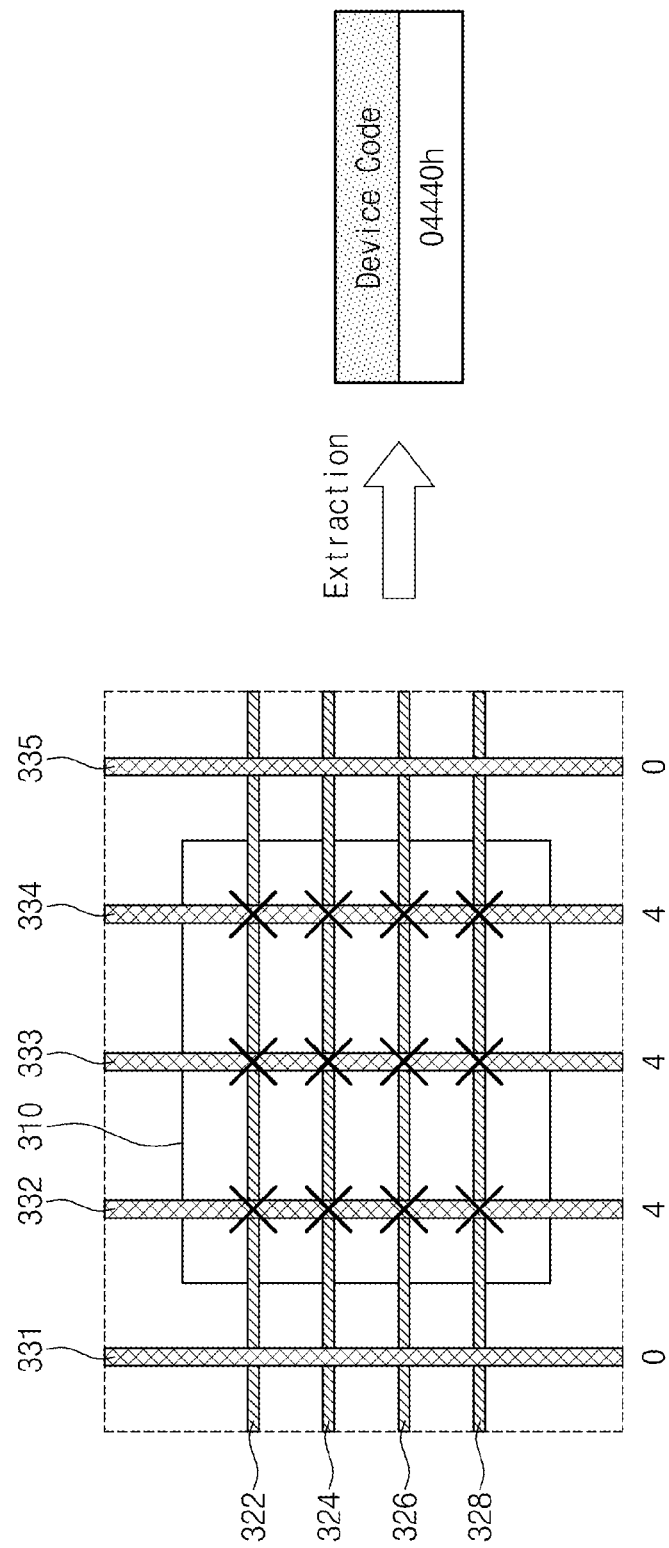
FIGS. 4A, 4B, and 4C are diagrams schematically illustrating a device code generating method of an LVC algorithm according to a geometry structure of an active region.
Figure 4B:
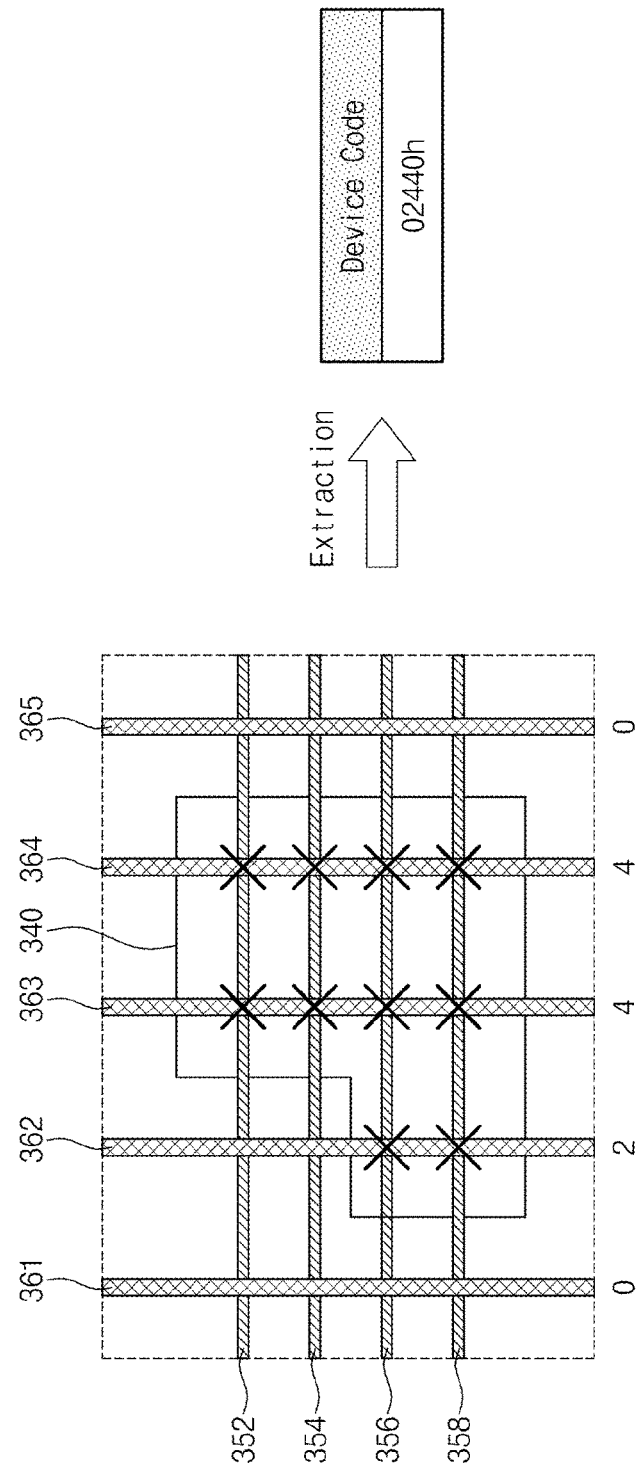
Figure 4C:
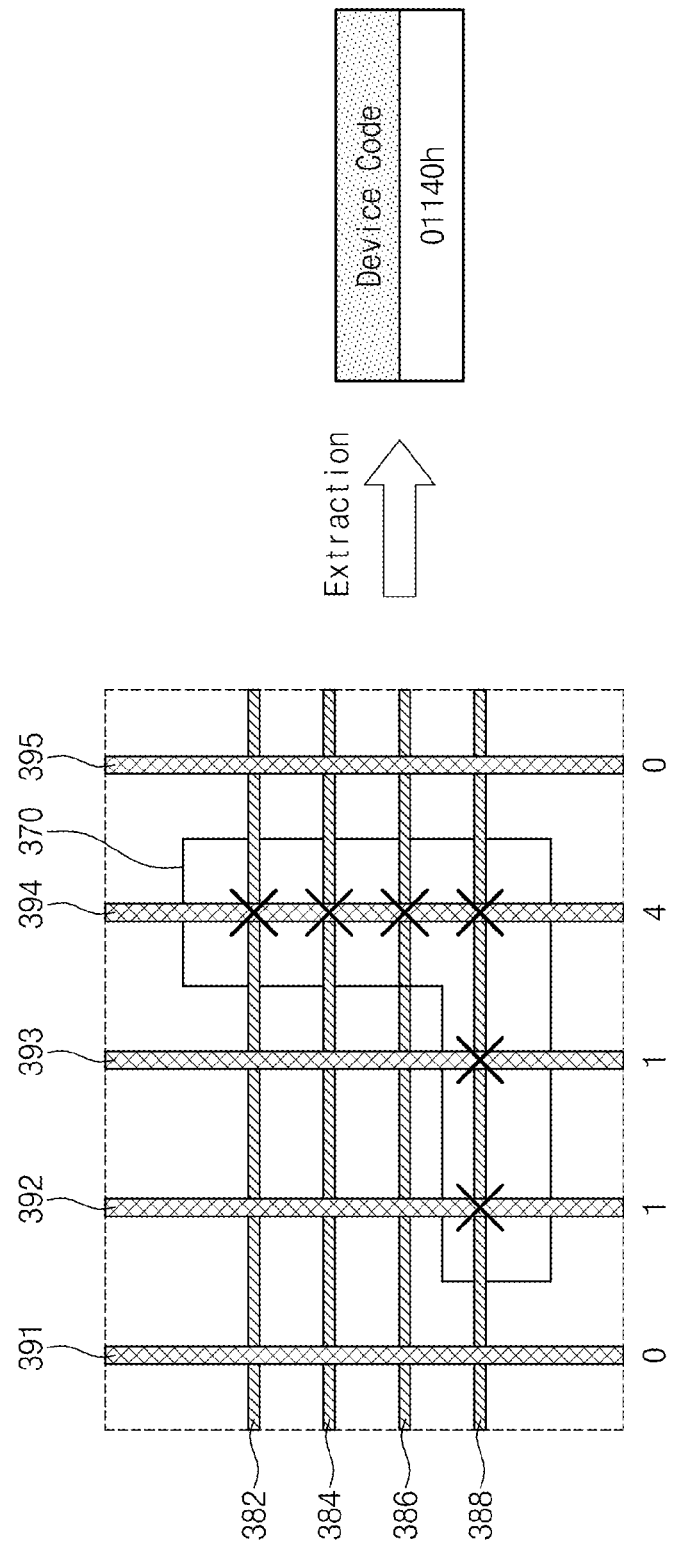

FIGS. 4A, 4B, and 4C are diagrams schematically illustrating a device code generating method of an LVC algorithm 135 according to a geometry structure of an active region. The layout verifying system 100 in FIG. 1 may use the LVC algorithm 135 to convert the layouts in FIGS. 4A, 4B, and 4C into respective device codes. FIG. 4A shows the event that device codes of three four-fin transistors formed of three gate lines 332, 333, and 334 and an active region 310 are generated. FIG. 4B shows the event that device codes of two four-fin transistors and two two-fin transistors formed of three gate lines 362, 363, and 364 and an active region 340 are generated. FIG. 4C shows the event that device codes of two one-fin transistor and one four-fin transistor formed of three gate lines 392, 393, and 394 and an active region 370 are generated.

Referring to FIG. 4A, a layout includes an active region 310, four silicon fins 322, 324, 326, and 328, and gate lines 331, 332, 333, 334, and 335. Since the gate line 331 is not overlapped with the active region 310, a device code of "0h" may be assigned to the gate line 331. The gate line 332 is overlapped with the active region 310 and is intersected with the silicon fins 322, 324, 326, and 328. A device code of "4h" corresponding to the number of intersecting points X may be assigned to the gate line 332. The gate line 333 is overlapped with the active region 310 and is intersected with the four silicon fins 322, 324, 326, and 328. A device code of "4h" corresponding to the number of intersecting points X may be assigned to the gate line 333. The gate line 334 is overlapped with the active region 310 and is intersected with the four silicon fins 322, 324, 326, and 328. A device code of "4h" corresponding to the number of intersecting points X may be assigned to the gate line 334. Since the gate line 335 is not overlapped with the active region 310, a device code of "0h" may be assigned to the gate line 335. Accordingly, if device codes respectively assigned to the gate lines 331, 332, 333, 334, and 335 are synthesized, a device code about the layout is determined as being "04440h".

Referring to FIG. 4B, a layout includes an active region 340, four silicon fins 352, 354, 356, and 358, and gate lines 361, 362, 363, 364, 365. Since the gate line 361 is not overlapped with the active region 340, a device code of "0h" may be assigned to the gate line 361. The gate line 362 is overlapped with the active region 340 and is intersected with the two silicon fins 356 and 358. A device code of "2h" corresponding to the number of intersecting points X may be assigned to the gate line 362. The gate line 363 is overlapped with the active region 340 and is intersected with the four silicon fins 352, 354, 356, and 358. A device code of "4h" corresponding to the number of intersecting points X may be assigned to the gate line 363. The gate line 364 is overlapped with the active region 340 and is intersected with the four silicon fins 352, 354, 356, and 358. A device code of "4h" corresponding to the number of intersecting points X may be assigned to the gate line 364. Since the gate line 365 is not overlapped with the active region 340, a device code of "0h" may be assigned to the gate line 365. Accordingly, if device codes respectively assigned to the gate lines 361, 362, 363, 364, and 365 are synthesized, a device code about the layout is determined as being "02440h".

Referring to FIG. 4C, a layout includes an active region 370, four silicon fins 382, 384, 386, and 388, and gate lines 391, 392, 393, 394, and 395. Since the gate line 391 is not overlapped with the active region 370, a device code of "0h" may be assigned to the gate line 391. The gate lines 392 and 393 are overlapped with the active region 370 and are intersected with the silicon fin 388. A device code of "1 h" corresponding to the number of intersecting points X may be assigned to the gate lines 392 and 393. The gate line 394 is overlapped with the active region 370 and is intersected with the four silicon fins 382, 384, 386, and 388. A device code of "4h" corresponding to the number of intersecting points X may be assigned to the gate line 394. Since the gate line 395 is not overlapped with the active region 370, a device code of "0h" may be assigned to the gate line 395. Accordingly, if device codes respectively assigned to the gate lines 391, 392, 393, 394, and 395 are synthesized, a device code about the layout is determined as being "01140h".

In FIGS. 4A, 4B, and 4C, example layouts are described for explaining a method according to example embodiments of inventive concepts for generating a device code according to whether bit lines and an active region intersect and the number of intersecting points where gate lines are silicon fins are intersected. Layouts illustrated in FIGS. 4A, 4B, and 4C are only examples to describe a device code generating method and are not associated with a specific function.

Figure 5:
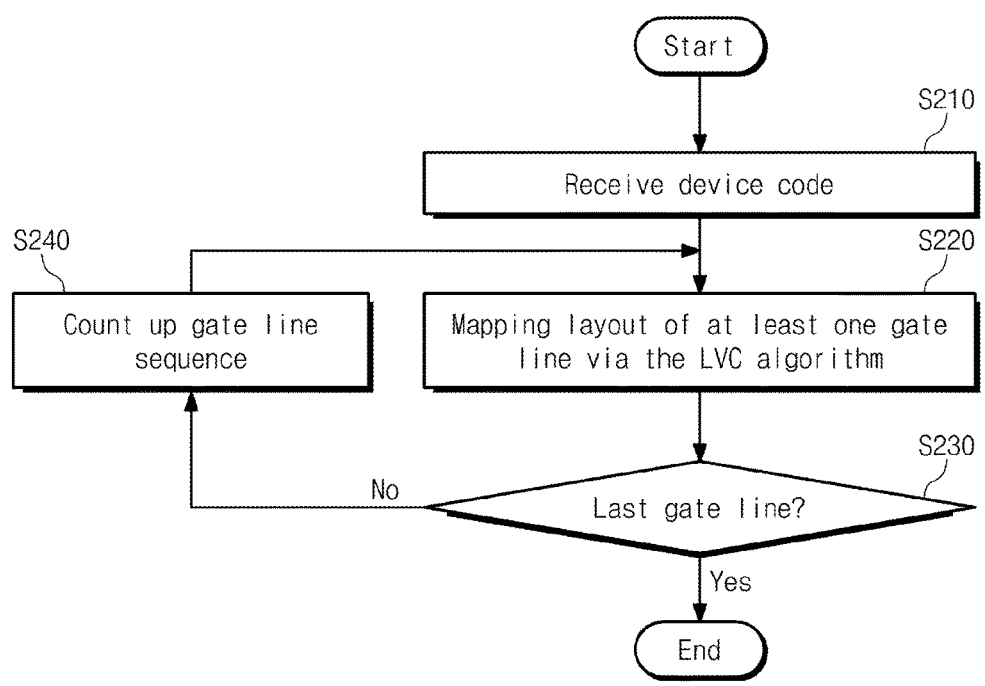
FIG. 5 is a flow chart schematically illustrating a method for converting a device code into a layout, according to example embodiments of inventive concepts.

FIG. 5 is a flow chart schematically illustrating a method for converting a device code into a layout, according to example embodiments of inventive concepts. Referring to FIG. 5, the layout verifying system 100 may convert a device code into a layout by using an LVC algorithm 135 (refer to FIG. 1).

In operation S210, a device corresponding to corresponding to a specific unit, such as a device unit, a cell unit, a block unit, or a chip unit, may be provided to a layout verifying system 100 (refer to FIG. 1) for conversion into a layout. When receiving the device code, the layout verifying system 100 may activate the LVC algorithm 135.

In operation S220, the layout verifying system 100 determines whether a gate line and an active region are overlapped and the number of events that the gate line and silicon fins are intersected at the overlapping region, based on a device code assigned by the gate line. A geometry structure of an active region and silicon fins associated with a gate line is expressed based on the above-described information. The layout verifying system 100 may show the geometry structure about a gate line and a silicon fin and an active region associated with the gate line or may store it as data.

In operation S230, there is determined whether a gate line mapped onto the layout is the last gate line of the layout. If so (Yes), the method ends. Otherwise, the method proceeds to operation S240 to count up a gate line sequence.

As described above, the layout verifying system 100 may use a LVC algorithm 135 to convert a device code into a layout that a designer can identify. Mutual conversion between a device code and a layout corresponding to a specific unit, such as a device unit, a cell unit, a block unit, or a chi unit, may be made by the LVC algorithm 135.

Figure 6:
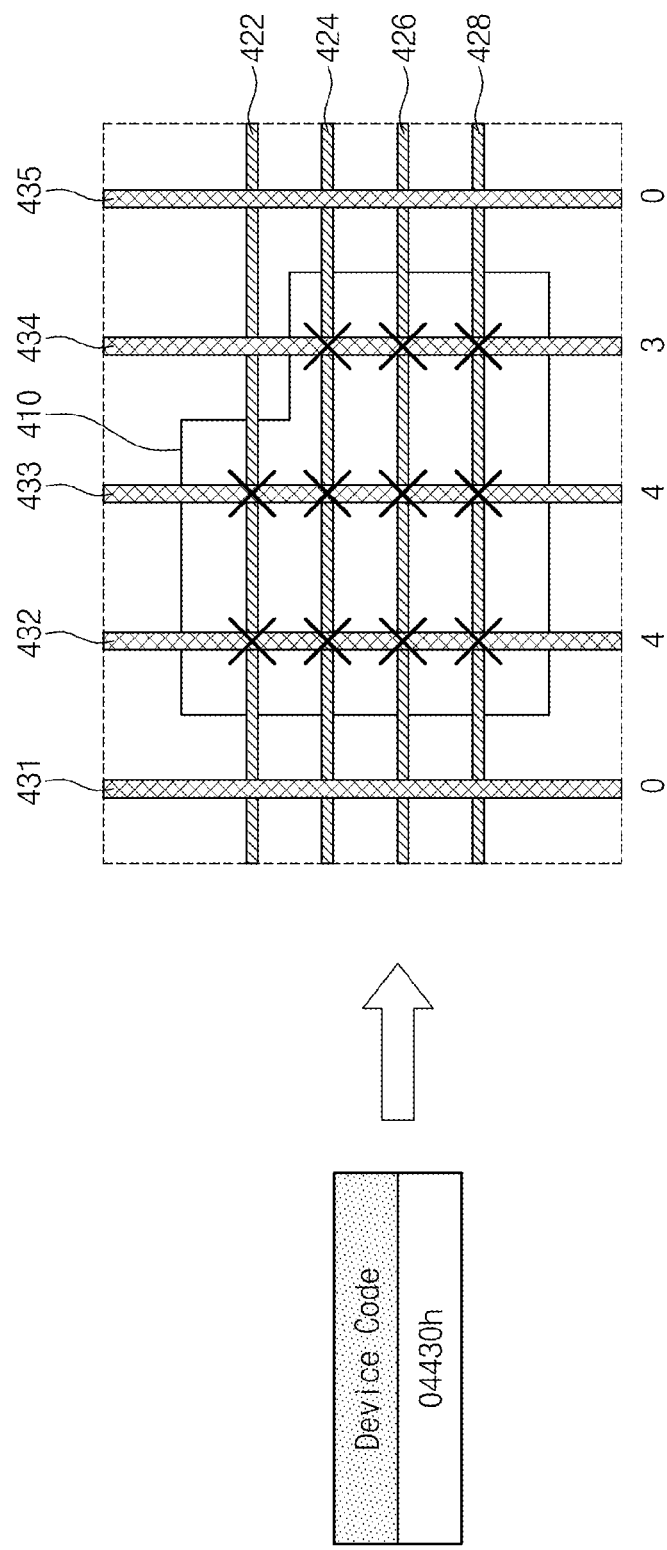
FIG. 6 is a diagram schematically illustrating conversion of a device code into a layout.

FIG. 6 is a diagram schematically illustrating conversion of a device code into a layout. Referring to FIG. 6, a device code of "04430h" is converted into two four-fin transistors and one 3-fin transistors.

First, there is mapped a gate line 431 that corresponds to a device code of "0h" corresponding to an MSB. The gate line 431 is not overlapped with an active region 410, so a transistor is not used to form a transistor. Next, there is mapped a gate line 432 corresponding to a device code of "4h". The gate line 432 corresponding to the device code of "4h" is overlapped with the active region 410 and is mapped such that it is intersected with silicon fins 422, 424, 426, and 428. There is mapped a gate line 433 having four intersecting points with the silicon fins 422, 424, 426, and 428. Then, a gate line 434 corresponding to the device code of "4h" is overlapped with the active region 410 and is mapped such that it is intersected with the three silicon fins 424, 426, and 428. Finally, a device code of "0h" corresponding to an LSB is mapped onto a gate line 435.

Here, the device code of "04430h" may include most information for expressing a layout. Accordingly, any shape of layout may be expressed only using a device code.

Figure 7:
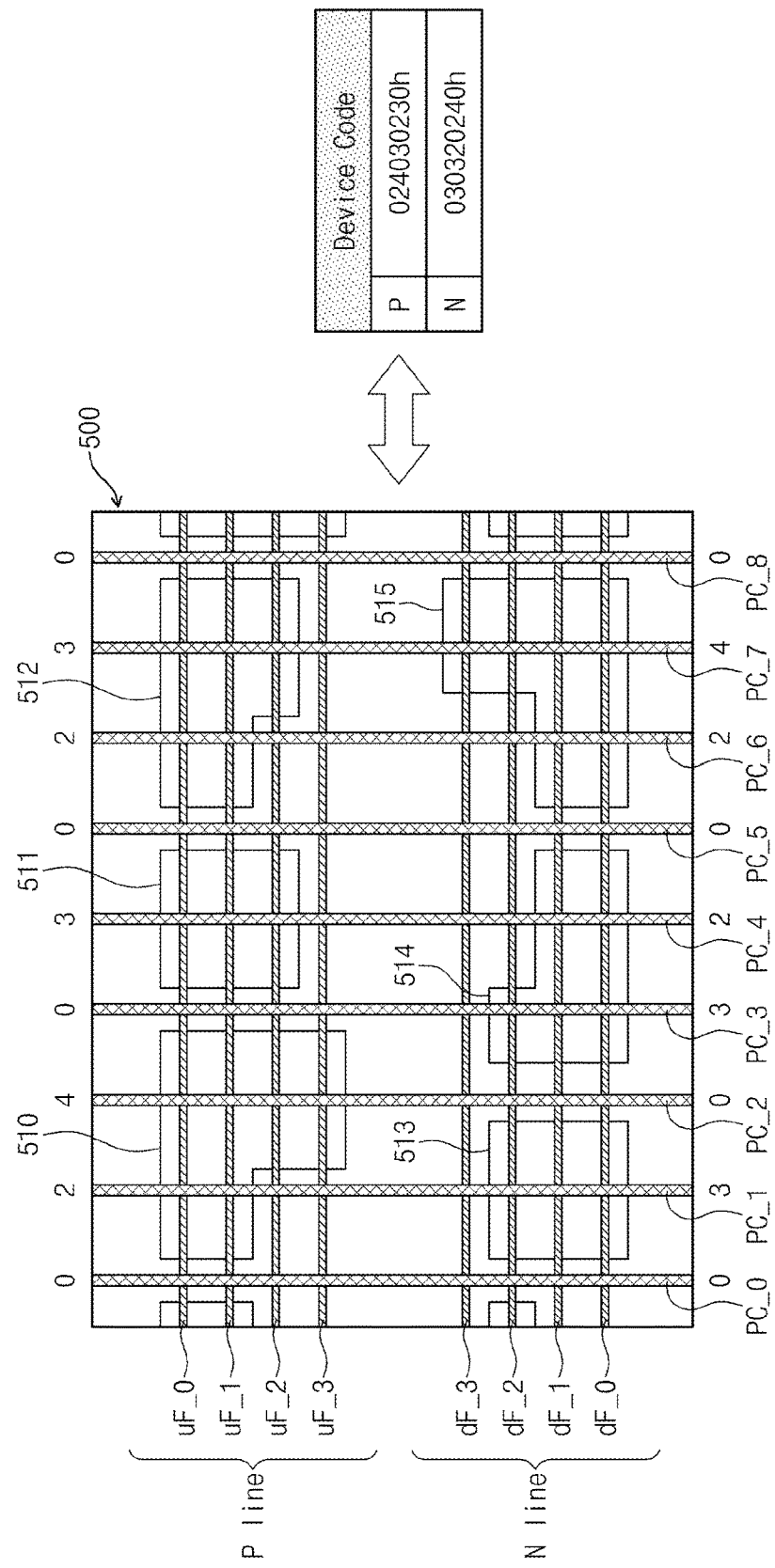
FIG. 7 is a diagram schematically illustrating an extended layout and a method for converting a device code about the extended layout, according to example embodiments of inventive concepts.

FIG. 7 is a diagram schematically illustrating an extended layout and a method for converting a device code about the extended layout, according to example embodiments of inventive concepts. Referring to FIG. 7, a layout 500 corresponding to a plurality of cells and a device code corresponding to the layout 500 are shown.

The layout 500 includes active regions 510, 511, 512, 513, 514, 515 for cells. The layout 500 may correspond to cells included in a cell row divided by a power rail. For example, the active regions 510, 511, and 512 to which n-type dopants are injected constitute a P line for forming a PMOS transistor, and the active regions 513, 514, and 515 to which p-type dopants are injected constitute an N line. The active regions 510, 511, 512, 513, 514, and 515 constitute transistors together with gate lines. Here, the layout 500 may include gate lines PC_0 to PC_8, silicon fins uF_0, uF_1, uF_2, and uF_3 included in the P line, and silicon fins dF_0, dF_1, dF_2, and dF_3 constituting the N line.

First, device codes about cells included in the P line are generated from the gate line PC_0. That is, a device code of "0240h" may be assigned to the active region 510, a device code of "030h" may be assigned to the active region 511, and a device code of "0230h" may be assigned to the active region 512. Accordingly, a device code of "024030230h" may be assigned to the P line. A device code of "030h" may be assigned to the active region 513 to generate a device code about the N line. A device code of "0320h" may be assigned to the active region 514, and a device code of "0240h" may be assigned to the active region 515. Accordingly, a device code of "030320240h" may be assigned to the N line.

As the device codes are generated, the device code about the P line has a value of "024030230h", and the device code about the N line has a value of "030320240h". The codes may be managed to form a layout unit.

Here, a geometry structure of an active region is described under the assumption that it is filled from a power line side to a center side. That is, a device code of "3h" corresponding to the active region 511 may correspond to the number of silicon fins counted in a top-to-center direction. In contrast, a device code of "3h" corresponding to the active region 513 may correspond to the number of silicon fins counted in a bottom-to-center direction. The number of silicon fins may be counted in a center-to-power rail direction. In an example, the number of silicon fins may be counted in a power rail-to-center direction.

In addition, a device code of "P;024030230h/N; 030320240h" may be exactly mapped onto a layout 500 by a layout verifying system 100 using an LVC algorithm. The active regions 510, 511, 512, 513, 514, and 515 corresponding to one cell row, silicon fins uF_0, uF_1, uF_2, and uF_3 constituting the P line, the silicon fins dF_0, dF_1, dF_2, and dF_3 constituting the N line, and the gate lines PC_0 to PC_8 are illustrated by the device code of "P;024030230h/ N;030320240h".

Figure 8A:
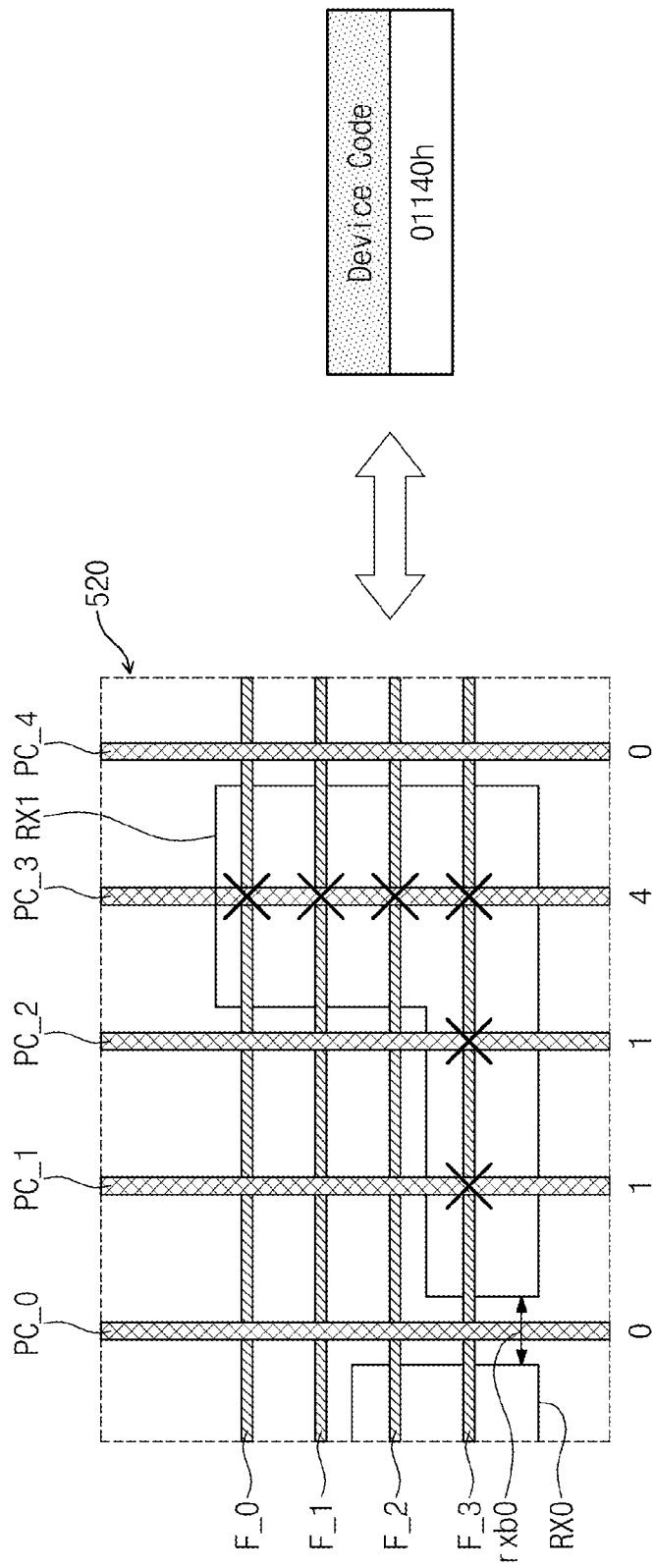
FIGS. 8A, 8B, and 8C are diagrams schematically illustrating a device code generating method according to example embodiments of inventive concepts.
Figure 8B:
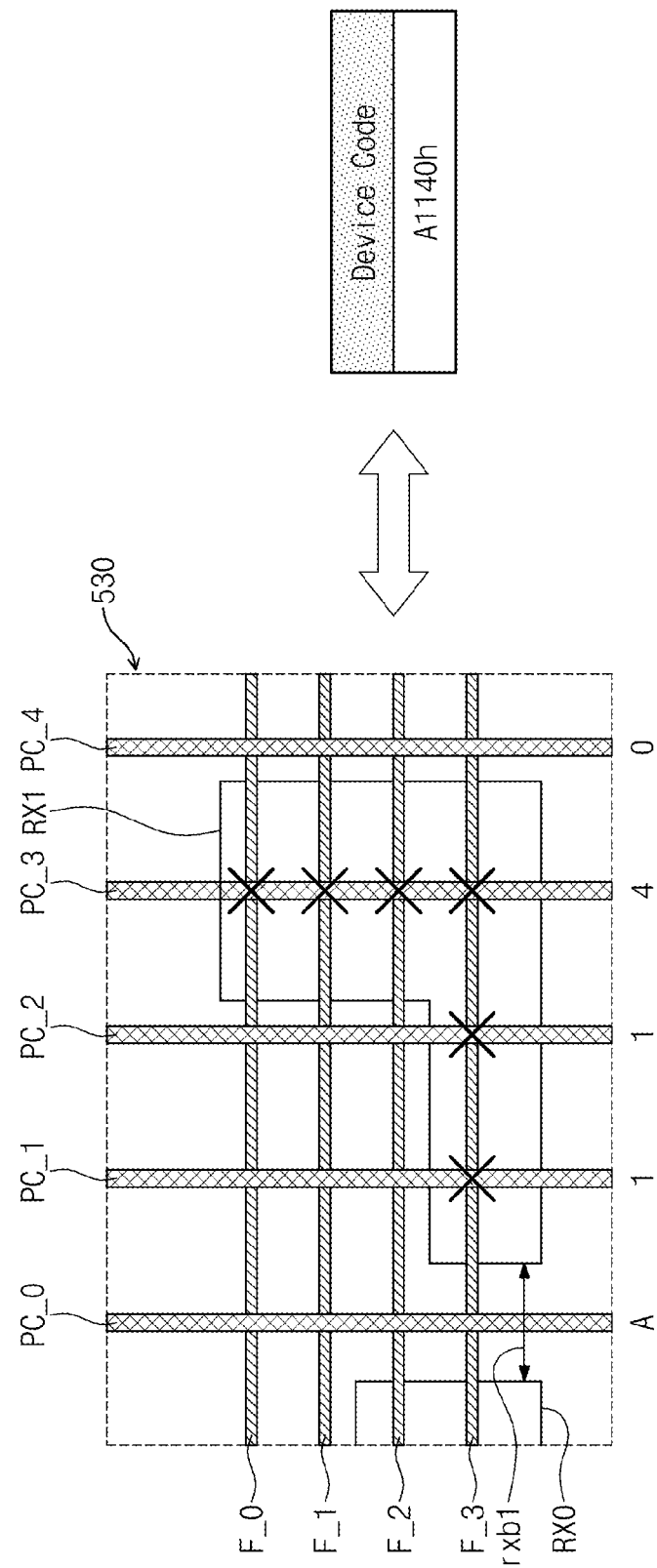
Figure 8C:
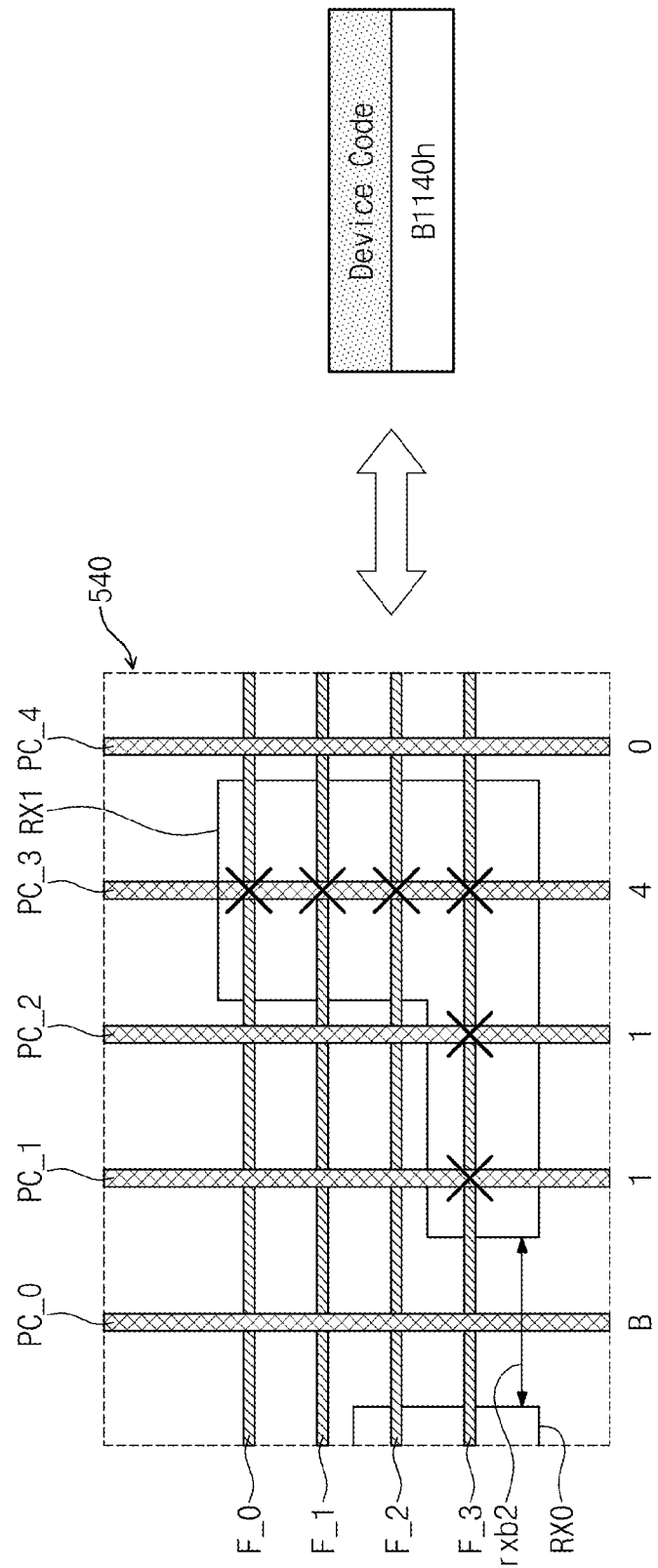

FIGS. 8A, 8B, and 8C are diagrams schematically illustrating a device code generating method according to example embodiments of inventive concepts. A device code of "0h" may be divided into various codes according to a distance between active regions. That is, a device code assigned to a gate line that is not overlapped with an active region may be divided into various code values according to a distance between active regions RX0 and RX1.

Referring to FIG. 8A, a layout 520 includes active regions RX0 and RX1, silicon fins F_0, F_1, F_2, and F_3, and gate lines PC_0, PC_1, PC_2, PC_3, and PC_4. The gate lines PC_0, PC_1, PC_2, PC_3, and PC_4 are overlapped with the active region RX1, and each of the gate lines PC_0, PC_1, PC_2, PC_3, and PC_4 is intersected with one or four silicon fins F_0, F_1, F_2, and F_3. A device code of "01140h" may be assigned to the gate lines PC_0, PC_1, PC_2, PC_3, and PC_4 according to the number of intersecting points X with silicon fins. A device code "0h" assigned to the gate line PC_0 means that a distance between the active regions RX0 and RX1 is a default distance rxb0. However, in a complicated layout structure, a distance between the active regions RX0 and RX1 may be shorter or longer than the default distance rxb0. In this case, a device code assigned to the gate line PC_0 that is not overlapped with the active regions RX0 and RX1 may be divided into various values.

Referring to FIG. 8B, there is illustrated an example where a distance rxb1 between the active regions RX0 and RX1 in a layout 530 becomes longer than the default distance rxb0. In this case, a device code assigned to the gate line PC_0 that is not overlapped with the active regions RX0 and RX1 may be expressed by "Ah". Device codes assigned to remaining gate lines PC_1, PC_2, PC_3, and PC_4 may be the same as values assigned in FIG. 8A. Accordingly, a device code of a layout 530 having a distance rxb1 between the active regions RX0 and RX1 not overlapped with the gate line PC_0 may be expressed by "A1140h".

Referring to FIG. 8C, there is illustrated an example where a distance rxb2 between active regions RX0 and RX1 in a layout 540 becomes longer than a distance rxb1. In this case, a device code assigned to the gate line PC_0 that is not overlapped with the active regions RX0 and RX1 may be expressed by "Bh". Device codes assigned to remaining gate lines PC_1, PC_2, PC_3, and PC_4 may be the same as values assigned in FIG. 8A. Accordingly, a device code of a layout 530 having a distance rxb2 between the active regions RX0 and RX1 not overlapped with the gate line PC_0 may be expressed by "B1140h".

There is described a method for dividing a device code of "0h" for partitioned physical quantity. Here, an example is described where "0h" may be assigned to a gate line placed between active regions spaced by a default distance. However, example embodiments of inventive concepts are not limited thereto. For example, a device code of "0h" may be divided into various values under the condition that "Bh" corresponds to a default distance and a distance decreases and increases. In addition, as well as a device code of "0h", device codes "1h", "2h", "3h", and "4h" may be various changed according to a width, depth, and a geometry structure of an active region, a threshold voltage, etc.

Figure 9:
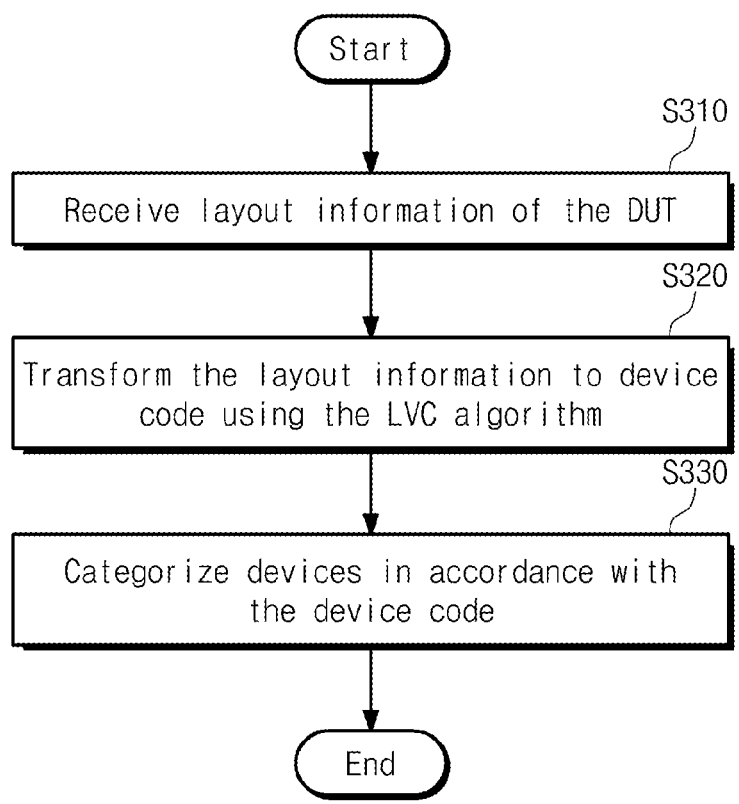
FIG. 9 is a flow chart schematically illustrating a layout analyzing method according to example embodiments of inventive concepts.

FIG. 9 is a flow chart schematically illustrating a layout analyzing method according to example embodiments of inventive concepts. Referring to FIG. 9, it is possible to analyze one cell or various devices included in a block or chip using a device code.

In operation S310, a layout corresponding to a cell, a block, or a chip to be analyzed is provided to a layout verifying system 100 (refer to FIG. 1). Alternatively, a layout generated by a layout design tool may be provided to the layout verifying system 100. The layout may correspond to the device under test (DUT). The layout verifying system 100 activates an LVC algorithm 135 in response to input layout and analysis request.

In operation S320, the layout verifying system 100 may drive the LVC algorithm 135 to assign device codes to the input layout by the gate line. The LVC algorithm 135 may determine whether a gate line and an active region are overlapped and the number of events that silicon fins and the gate line are intersected at the overlapping region. The input layout may be converted into a device code based on the above-described information. The device code may be stored at a working memory 130 or a storage device 170 of the layout verifying system 100.

In operation S330, the layout verifying system 100 divides the stored device code into patterns having a smaller unit. That is, a layout may be analyzed according to a structure of a cell, a device, or an active region included in the layout. For example, device codes between device codes of "0h" are divided according to a shape of an active region, and the number of device codes thus divided may be counted. In this case, it is possible to statistically analyze the frequency of use about patterns included in a chip, a block, or a cell. The statistically analyzed information about the patterns may be variously used when a designer designs a layout.

There are described extracting of a device code about a layout and analyzing of a pattern about a layout using the same.

Figure 10:
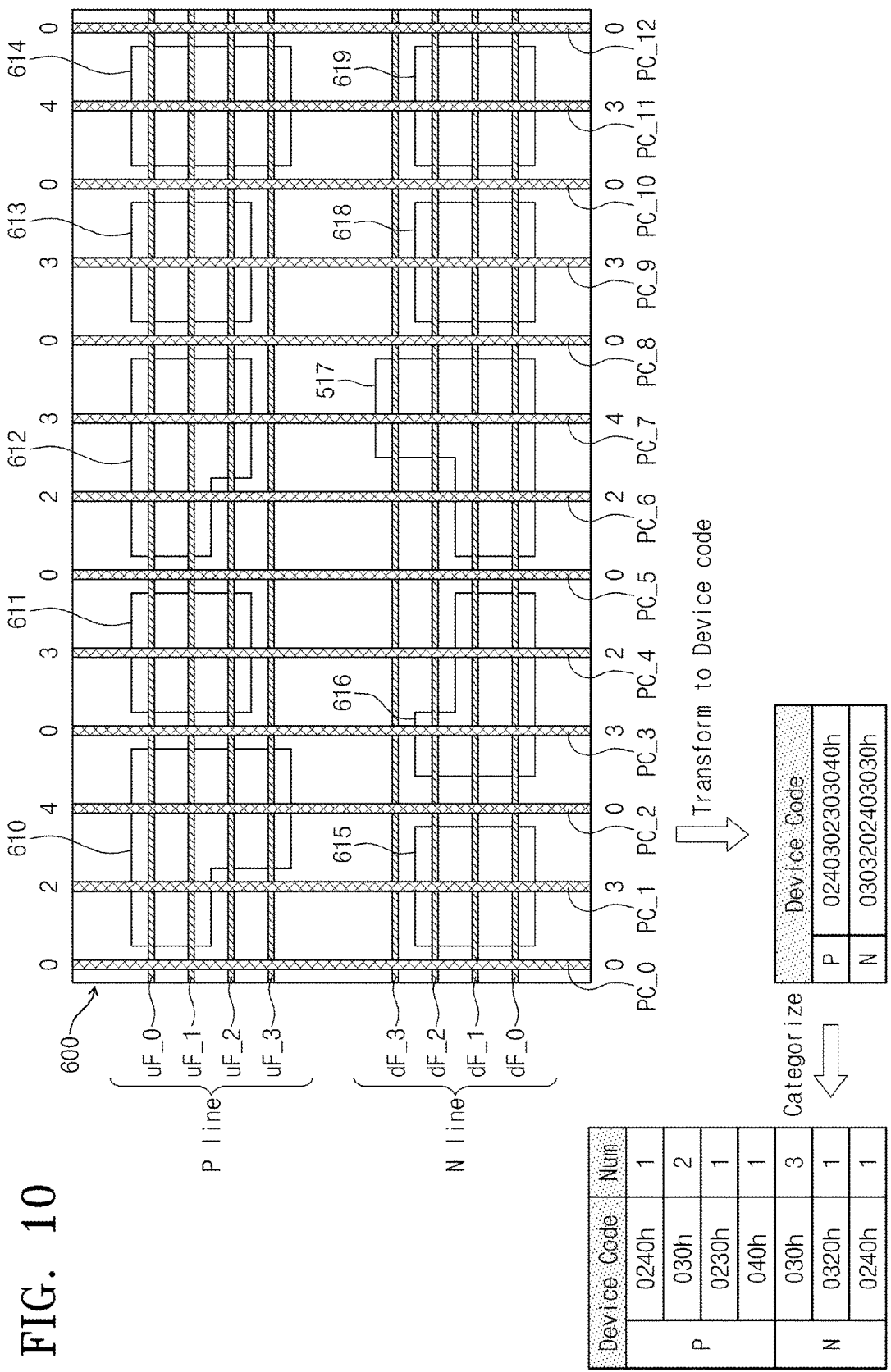
FIG. 10 is a diagram schematically illustrating an analysis method of FIG. 9.

FIG. 10 is a diagram schematically illustrating an analysis method of FIG. 9. Referring to FIG. 10, a layout 600 input by a layout designer or generated by a layout verifying system 100 is converted into a device code and is classified according to a pattern.

The layout 600 includes active regions 610 to 619 for forming a plurality of cells. The layout 600 includes cells included in a cell row divided by a power rail. For example, the active regions 610 to 614 to which n-type dopants are injected constitute a P line for forming a PMOS transistor, and the active regions 615 to 619 to which p-type dopants are injected constitute an L line. Here, the layout 600 may include gate lines PC_0 to PC_12, silicon fins uF_0, uF_1, uF_2, and uF_3 included in the P line, and silicon fins dF_0, dF_1, dF_2, and dF_3 constituting the N line.

An LVC algorithm 135 generates device codes about cells included in the P line from the gate line PC_0. That is, a device code of "0240h" may be assigned to the active region 610, a device code of "030h" may be assigned to the active region 611, and a device code of "0230h" may be assigned to the active region 612. A device code of "030h" extracted from the active region 613, and a device code of "040h" is extracted from the active region 614. Accordingly, a device code of "0240302303040h" may be assigned to the P line. A device code about the N line may be extracted as follow. A device code of "030h" may be assigned to the active region 615, a device code of "0320h" may be assigned to the active region 616, and a device code of "0240h" may be assigned to the active region 617. A device code of "030h" may be assigned to the active region 618, and a device code of "030h" may be assigned to the active region 619. Accordingly, a device code of about the N line is generated as being "0303202403030h".

By generating of the above-described device code, the layout 600 is extracted from a device code of "P;024030230h/N;0303202403030h". The layout verifying system 100 analyzes patterns using the extracted device code. For example, one device code of "0240h", two device codes of "030h", one device code of "0230h", and one device code of "040h" are collected as N-type patterns. Three device codes of "030h", one device code of "0320h", and one device code of "0240h" are collected as N-type patterns. According to a pattern shape based classification method, a digital pattern may be statistically analyzed using a device code with respect to all patterns included in a layout.

Figure 11:
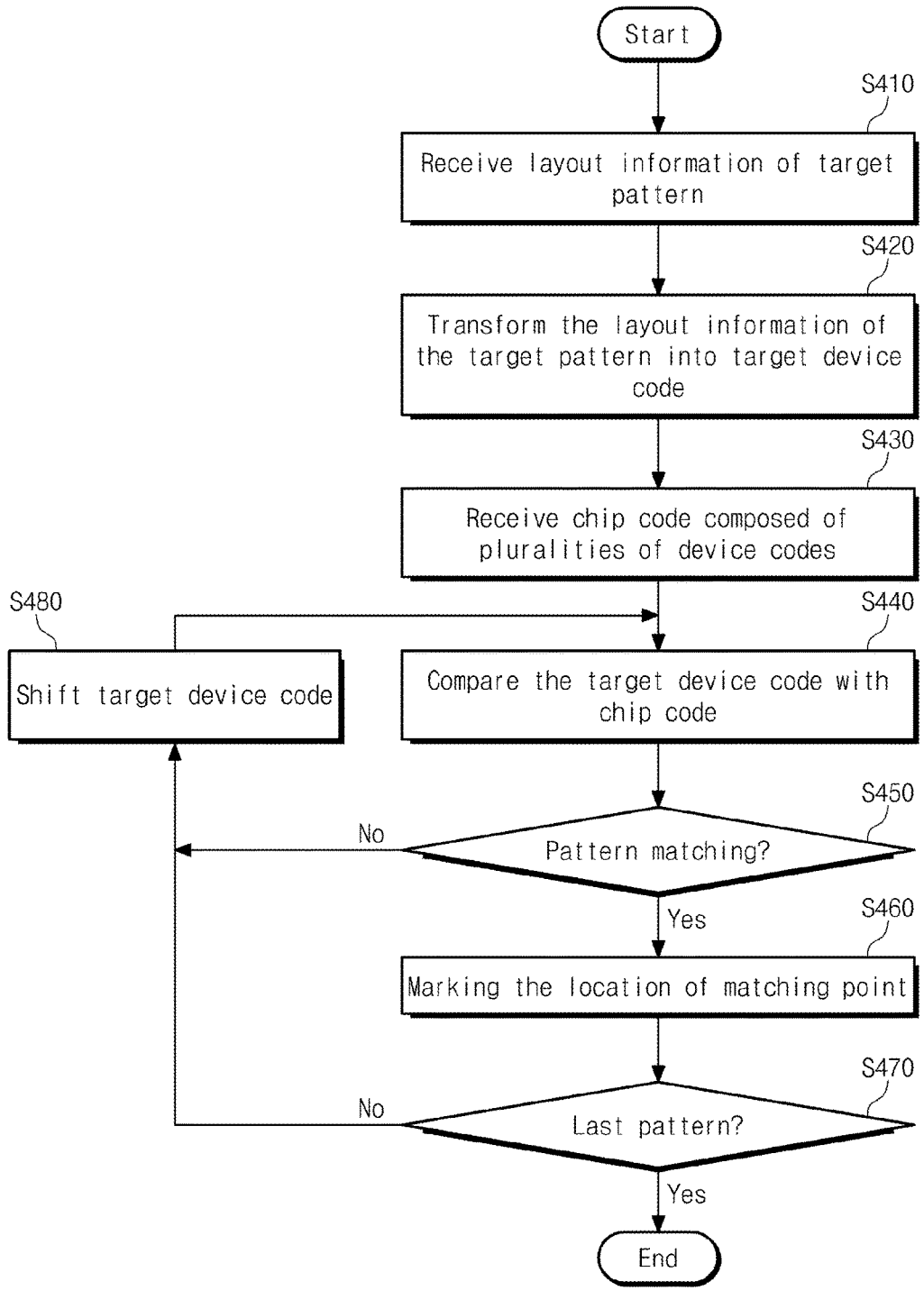
FIG. 11 is a flow chart schematically illustrating a pattern matching method according to example embodiments of inventive concepts.

FIG. 11 is a flow chart schematically illustrating a pattern matching method according to example embodiments of inventive concepts. Referring to FIG. 11, in example embodiments of inventive concepts, if a device code concept is used, pattern matching for detecting a location, a number, etc. on a chip having a specific pattern may be efficiently performed in designing a layout.

In operation S410, a layout verifying system 100 (refer to FIG. 1) receives a target pattern as a detection target. For example, the layout verifying system 100 may be provided with a layout, corresponding to a specific device, a cell, or a block, as a target pattern.

In operation S420, the layout verifying system 100 activates an LVC algorithm 135 to convert the input target pattern into a device code. The LVC algorithm 135 determines whether a gate line and an active region are overlapped and the number of events that the gate line and silicon fins are intersected at the overlapping region. The input target pattern is converted into a device code based on the above-described information. The device code thus converted may be stored at a working memory 130 or a storage device 170 of the layout verifying system 100. Operations S410 and S420 may be skipped when a device code corresponding to the target pattern is directed received.

In operation S430, the layout verifying system 100 receives a device code about a chip corresponding to a search target. If there is layout information differing from a device code about a chip or block where pattern matching is performed, an operation where such information is converted into a device code may be added.

In operation S440, the layout verifying system 100 detects correlation between a target device code and a chip code. That is, the layout verifying system 100 may sequentially scan the chip code (e.g., from a start portion thereof) to determine whether it includes the same portion as the target device code.

In operation S450, the layout verifying system 100 determines whether a portion matched with the target device code is detected. If a portion matched with the target device code is detected, the method proceeds to operation S460. If patterns of the target device code and the chip code corresponding to a current scan position in a chip are not identical to each other, the method proceeds to operation S480 in which a pattern corresponding to a scan target is shifted.

In operation S460, the layout verifying system 100 marks location information about a portion where patterns of the target device code and the chip code are identical to each other. For example, if there is found the same code as a target device code at a specific cell row of a chip, the layout verifying system 100 may add a matching mark to a corresponding location of the chip.

In operation S470, the layout verifying system 100 determines a location where a correlation operation is currently performed corresponds to the last pattern. If so, the method ends. Otherwise, the method proceeds to operation S480.

In operation S480, the layout verifying system 100 shifts a device code of a chip to be compared with the target device code. A device code may be shifted from left to right of a chip and all patterns are compared with the target device code. Afterwards, the method proceeds to operation S440 to compare the target pattern and the shifted pattern.

There is described a pattern matching method using a device code according to example embodiments of inventive concepts. In example embodiments of inventive concepts, if a device code is used, high-speed pattern matching may be performed through logical computation because digital information is provided as a target pattern and a chip pattern.

Figure 12:
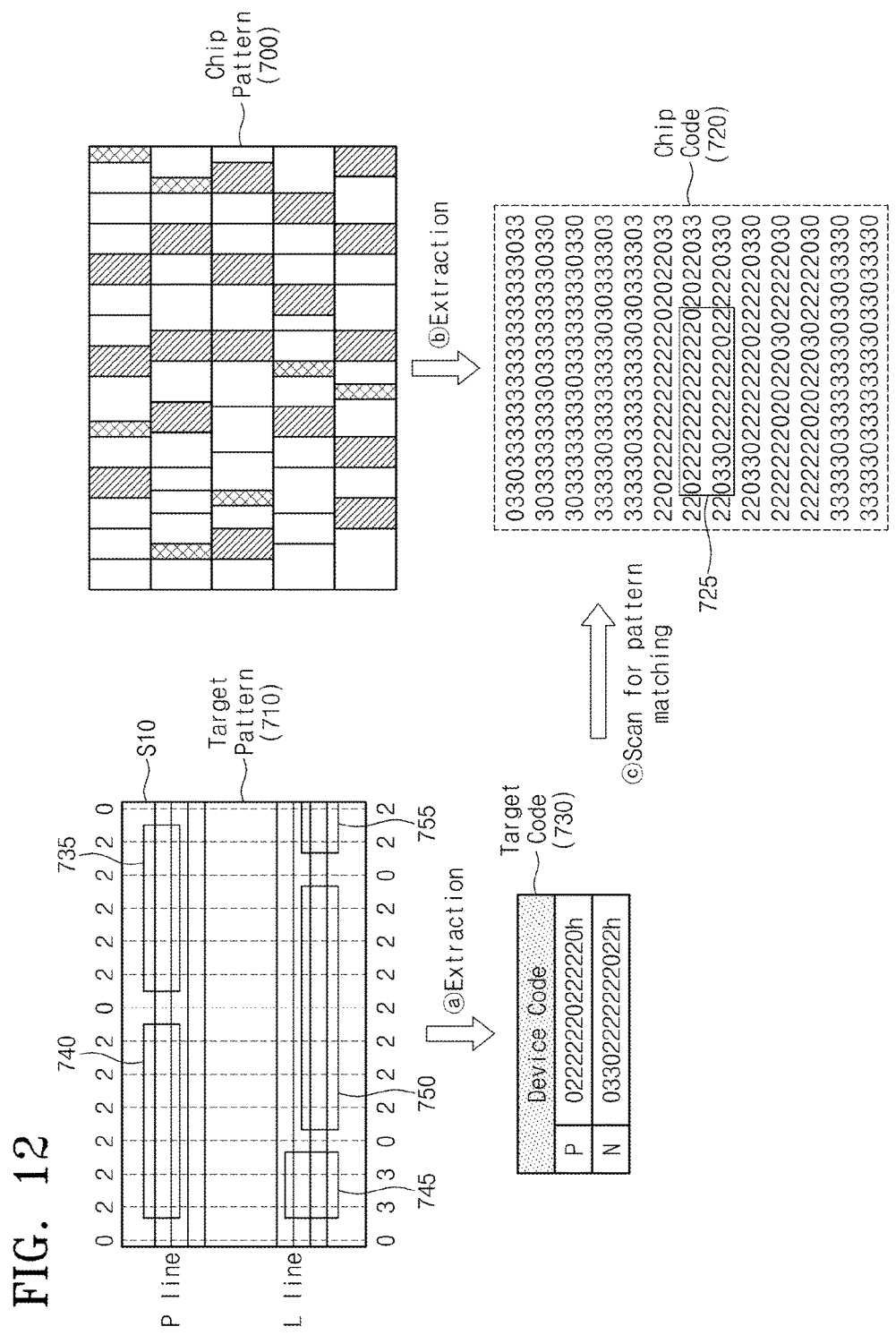
FIG. 12 is a diagram visually illustrating a pattern matching method of FIG. 11.

FIG. 12 is a diagram visually illustrating a pattern matching method of FIG. 11. Referring to FIG. 12, a target code 730 is extracted by converting a target pattern 710 into device codes. A chip code 720 is extracted by converting a chip pattern 700 into device codes. A layout verifying system 100 (refer to FIG. 1) compares the target code 730 and the chip code 720 for pattern matching. The layout verifying system 100 detects whether the same pattern exists.

In step (ⓐ), the target code 730 is extracted from the target pattern 710. The target pattern 710 may be a layout corresponding to a cell or a block where there is detected the same pattern exists on a chip. The target code 730 is extracted from the target pattern 710 based on gate lines (dotted line) and the number of intersecting points with silicon fins (solid line). This extraction may be performed by an LVC algorithm 135.

In step (ⓑ), the chip code 720 is extracted from the chip pattern 700, which is performed by the LVC algorithm 135.

In step (ⓒ), the target code 730 is compared with codes of the chip code 720. If there is detected the same code 725 as the target code 730, a location where the same code 725 is detected may indicate a location where the target pattern 710 is formed.

The above-described pattern matching may be performed only through comparison or correlation between codes, thereby making it possible to perform high-speed pattern matching. A lot of time and effort may be required to search for a location of the same pattern only using a layout. Also, such a pattern matching method may not provide required accuracy. In contrast, high accuracy, speed and efficiency may be provided when pattern matching is performed only using a layout.

Figure 13:
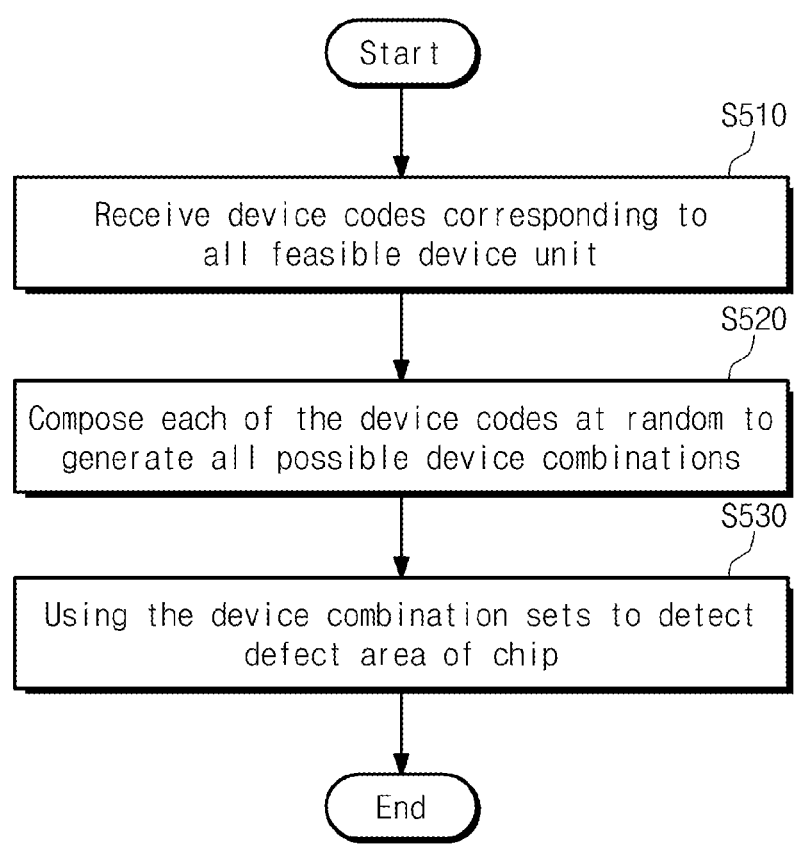
FIG. 13 is a flow chart schematically illustrating a method where a test pattern is converted with a device code and a test operation is performed using the test pattern, according to example embodiments of inventive concepts.

FIG. 13 is a flow chart schematically illustrating a method where a test pattern is converted with a device code and a test operation is performed using the test pattern, according to example embodiments of inventive concepts. Referring to FIG. 13, all layout patterns on a chip may be converted into device codes. A pattern, such as a block, a cell, etc. capable of being formed on a chip, may be synthesized based on device codes for test.

In operation S510, a layout verifying system 100 (refer to FIG. 1) receives a layout or a device code about all devices capable of being formed on a chip. In the event that layouts of all devices are received, converting into layouts into device codes may be made using an LVC algorithm 135. If device codes about patterns are received, the converting may be skipped.

In operation S520, the layout verifying system 100 composes the device codes to generate all possible device combinations.

In operation S530, the layout verifying system 100 detects a pattern, causing a defect, from among the composed combinations or may detect a combination including a pattern causing a defect.

Figure 14:
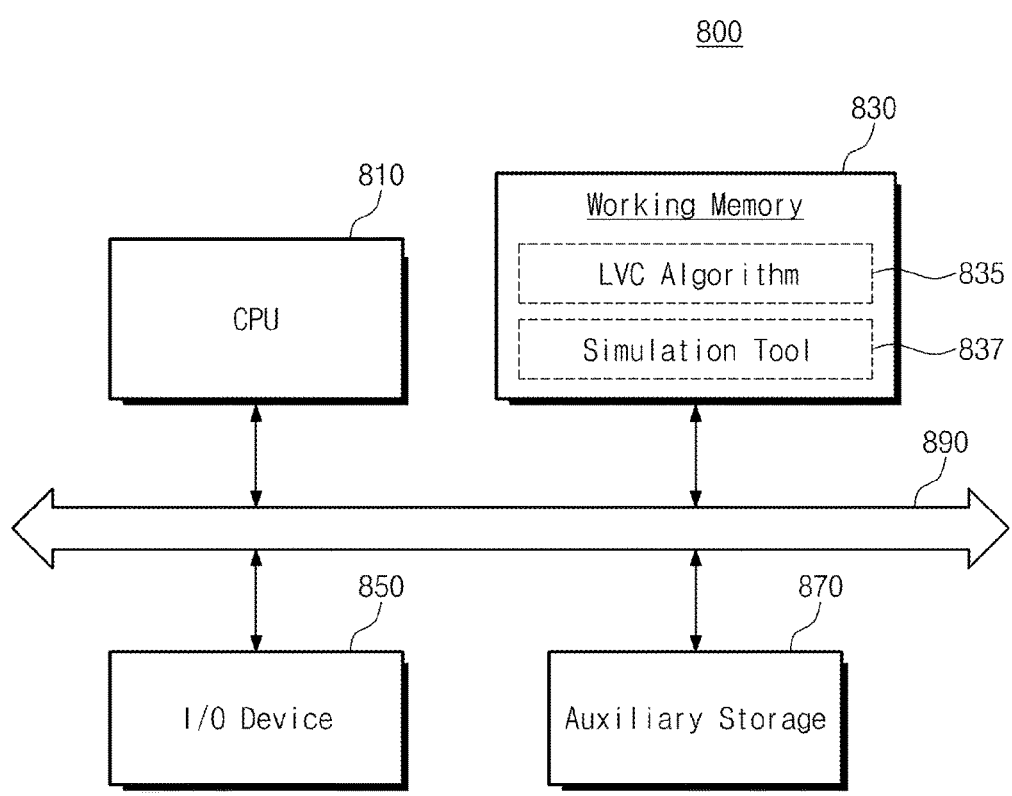
FIG. 14 is a block diagram schematically illustrating a layout design system 800 according to example embodiments of inventive concepts.

FIG. 14 is a block diagram schematically illustrating a layout design system 800 according to example embodiments of inventive concepts. Referring to FIG. 14, a layout design system 800 simulates a schematic circuit using a device code. The layout design system 800 contains a Central Processing Unit (CPU) 810, a working memory 830, an input/output device 850, a storage device 870, and a bus 890. Functions or configurations of the CPU 810, the input/output device 850, and the storage device 870, etc. are substantially the same as those in FIG. 1, and a detailed description thereof is thus omitted.

An LVC algorithm 835 may be loaded on the working memory 830. In particular, a simulation tool for simulating a schematic circuit is also loaded on the working memory 830. The LVC algorithm 835 converts a layout, which is generated after verifying a schematic circuit, into a device code. Also, the LVC algorithm 835 may convert a device code into a layout. The LVC algorithm 835 may convert a device code into a parameter for expressing a schematic circuit. For example, a netlist for simulating a schematic circuit may be implemented using a device code. After a device code is converted into a parameter of a schematic circuit, the simulation tool 837 simulates a schematic circuit about a layout.

Figure 15:
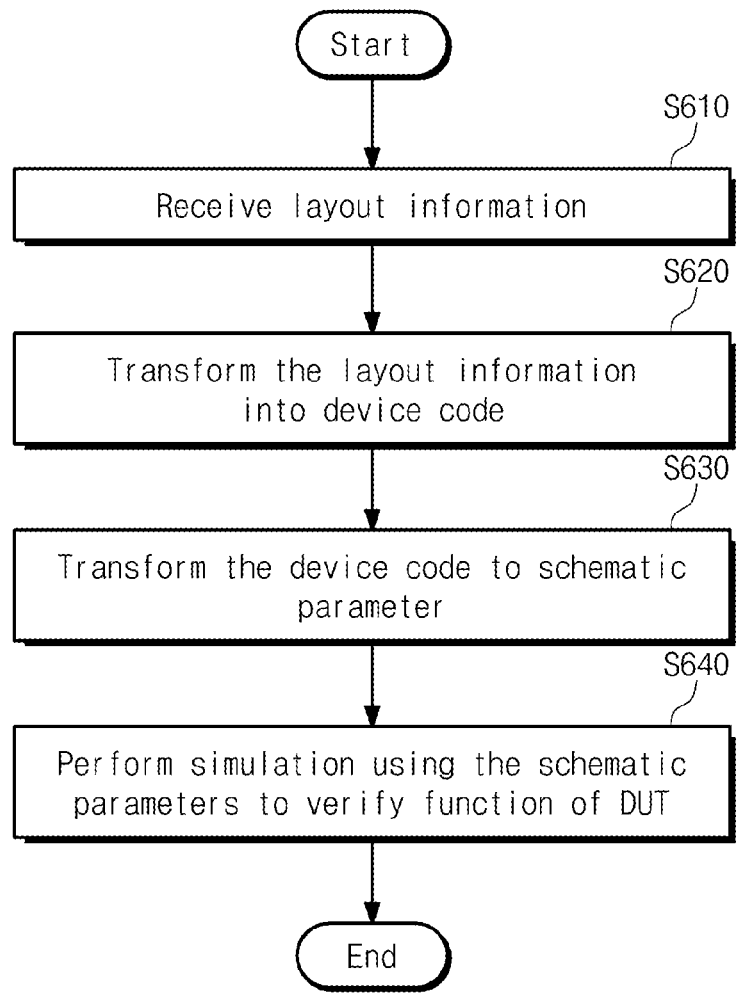
FIG. 15 is a flow chart schematically illustrating a schematic circuit simulating method using a device code of FIG. 14.

FIG. 15 is a flow chart schematically illustrating a schematic circuit simulating method using a device code of FIG. 14. Referring to FIG. 15, a layout design system 800 according to example embodiments of inventive concepts extracts a device code from a layout and convers the device code into a parameter of a schematic circuit.

In operation S610, the layout design system 800 receives a layout corresponding to a device, a cell, a block, or a chip. The layout design system 800 may also receive layout information generated by a layout design tool.

In operation S620, a layout verifying system 100 drives an LVC algorithm 835 to assign a device code to layout information by the gate line. The LVC algorithm 835 may determine whether a gate line and an active region are overlapped and the number of events that silicon fins and the gate line are intersected. The LVC algorithm 835 converts the layout information into a device code based on the above-described information. The device code thus converted may be stored at a working memory 830 or a storage device 870 of the layout design system 800.

In operation S630, the layout design system 800 converts the device code into a schematic parameter. For example, device codes about a pattern indicating a transistor may be used to express an equivalent circuit such as a resistor or a capacitor.

In operation S640, the layout design system 800 performs simulation using the schematic parameters to verify a function of a device under test. A pattern or channel size of a layout may be again adjusted using a simulation result.

A memory system according to the inventive concept may be packaged according to any of a variety of different packaging technologies. Examples of such packaging technologies may include the following: PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A method of operating a layout verifying system including a processor, the method comprising:
   receiving a circuit layout that corresponds to a circuit, the circuit layout including gate lines organized as gate line units;
   extracting device codes from the circuit layout using the processor,
   the device codes each being an expression of the gate lines in a same one of the gate line units in the circuit layout,
   the extracting the device codes from the circuit layout including assigning different values to the gate lines based on corresponding structures in the circuit layout that intersect the gate lines; and one of
      synthesizing a code stream from the device codes, and
      determining whether a target device code that corresponds to a target pattern is the same as one of the device codes by sequentially scanning the device codes for a match.

2. The method of claim 1, wherein
   the gate line units further include an active region and a number of intersecting points with silicon fins, and
   the one of the synthesizing the code stream and the determining whether the target device code is the synthesizing the code stream from the device codes, and
   the code stream is synthesized using one or more device codes that are extracted according to a gate line sequence to form a synthesized one or more device codes.

3. The method of claim 2, wherein the extracting device codes includes assigning a code to one gate line among the gate lines based on the corresponding to number silicon fins that are intersected by the one gate line.

4. The method of claim 3, wherein the extracting device codes includes counting intersecting points between the silicon fins and the one gate in a top-to-bottom direction or a bottom-to-top direction of the layout.

5. The method of claim 2, wherein the circuit corresponds to at least one of a transistor device, a cell, a block, and a chip.

6. The method of claim 2, further comprising:
   classifying the one or more device codes of the code stream according to a pattern unit having a same code stream.

7. The method of claim 2, wherein the circuit corresponds to one device, and
   the extracting device codes from the circuit layout using the processor includes extracting the one or more device codes about various layout shapes for the device.

8. The method of claim 7, further comprising:
   forming a test pattern by randomly connecting and synthesizing device codes corresponding to the various layout shapes.

9. The method of claim 2, further comprising:
   converting the device codes into a schematic parameter for expressing a schematic circuit.

10. The method of claim 9, further comprising:
    forming a netlist using the schematic parameter; and
    performing schematic simulation using the netlist.

11. The method of claim 2, wherein the extracting device codes includes assigning a code "0" to one gate line among the gate lines that does not overlap the active region from among the gate lines.

12. The method of claim 11, wherein the extracting device codes includes dividing the code of "0" corresponding to the one gate line into sub-codes according to a distance between the one gate line and the active region adjacent to the one gate line.

13. The method of claim 1, wherein
    the circuit is a Fin-based integrated circuit,
    the gate lines in the circuit layout include first gate lines and second gate lines,
    the first gate lines cross a non-active region,
    the second gate lines cross an active region, and
    the extracting the device code from the circuit layout including assigning a "0" to the first gate lines, and assigning values to the second gate lines respectively based on a number of fins that intersect each respective one of the second gate lines.

14. The method of claim 1, wherein
    the method includes the determining whether the target device code that corresponds to the target pattern is the same as one of the device codes by sequentially scanning the device codes for the match, and
    the method further includes storing information about locations of the matching codes in a memory of the layout verifying system.

15. The method of claim 1, further comprising:
    converting the device codes into a schematic parameter for expressing a schematic circuit.

16. The method of claim 15, further comprising:
    forming a netlist using the schematic parameter; and
    performing schematic simulation using the netlist.

17. A method for detecting the same pattern as a target pattern in a specific integrated circuit unit in a layout design and verifying system including a processor, the method comprising:
    receiving a circuit layout that corresponds to a circuit, the circuit layout including gate lines organized as gate line units, wherein the receiving the circuit layout includes receiving a layout of the target pattern as the circuit layout;
    extracting device codes from the circuit layout using the processor, the device codes each being an expression of the gate lines in a same one of the gate line units in the circuit layout, the extracting the device codes from the circuit layout including assigning different values to the gate lines based on corresponding structures in the circuit layout that intersect the gate lines, wherein the extracting the device codes includes extracting a target device code from the layout of a target pattern, the target device code being based on an active region, the gate lines, and a number of intersecting points with silicon fins of the layout of the target pattern; and one of synthesizing a code stream from the device codes, and determining whether a target device code that corresponds to a target pattern is the same as one of the device codes by sequentially scanning the device codes for a match, wherein the one of synthesizing the code stream from the device codes and determining whether the target device code is the determining whether the target device that corresponds to the target pattern is the same as one of the device codes by sequentially scanning the device codes for the match, and the determining whether the target device that corresponds to the target pattern is the same as one of the device codes by sequentially scanning the device codes for the match is performed by determining whether a test code includes a same portion as the target device code by sequentially scanning the test code, the test code corresponding to the specific integrated circuit; and storing information about a location where the test code includes the same portion as the target device code in response to the same portion as the target device code being detected in the test code.

18. The method of claim 17, wherein the target device code is extracted as a value corresponding to a number of events that gate lines overlapped with the active region are intersected with the silicon fins.

19. The method of claim 17, further comprising:
converting a layout corresponding to the specific integrated circuit unit into the test code.

20. The method of claim 19, wherein the specific integrated circuit unit corresponds to at least one of a chip, a block, or cells.

* * * * *